(12) United States Patent
Nishimura et al.

(10) Patent No.: US 11,482,558 B2
(45) Date of Patent: Oct. 25, 2022

(54) IMAGING DEVICE INCLUDING UNIT PIXEL CELL

(71) Applicant: PANASONIC INTELLECTUAL PROPERTY MANAGEMENT CO., LTD., Osaka (JP)

(72) Inventors: Kazuko Nishimura, Kyoto (JP); Yutaka Abe, Osaka (JP); Masashi Murakami, Kyoto (JP); Yoshiyuki Matsunaga, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/859,623

(22) Filed: Apr. 27, 2020

(65) Prior Publication Data

US 2020/0258933 A1 Aug. 13, 2020

Related U.S. Application Data

(63) Continuation of application No. 16/161,903, filed on Oct. 16, 2018, now Pat. No. 10,672,827, which is a
(Continued)

(30) Foreign Application Priority Data

Dec. 26, 2014 (JP) ................................ 2014-264696
Oct. 21, 2015 (JP) ................................ 2015-207303

(51) Int. Cl.
*H01L 27/146* (2006.01)
*H04N 5/357* (2011.01)
(Continued)

(52) U.S. Cl.
CPC ..... *H01L 27/14643* (2013.01); *H04N 5/3575* (2013.01); *H04N 5/363* (2013.01); *H04N 5/378* (2013.01)

(58) Field of Classification Search
CPC .............. H01L 27/14643; H04N 5/3575; H04N 5/363; H04N 5/378; H04N 5/369; H04N 5/374; H04N 5/3741; H04N 5/3745
See application file for complete search history.

(56) References Cited

U.S. PATENT DOCUMENTS 5,296,696 A   3/1994   Uno
5,852,296 A   12/1998  Tsukamoto et al.
(Continued)

FOREIGN PATENT DOCUMENTS

CN   1257642 C     5/2006
JP   H10-170658 A  6/1998
(Continued)

OTHER PUBLICATIONS

Non-Final Office Action dated Apr. 7, 2017 in U.S. Appl. No. 14/965,687.
(Continued)

*Primary Examiner* — Albert H Cutler
(74) *Attorney, Agent, or Firm* — McDermott Will & Emery LLP

(57) ABSTRACT

An imaging device having a pixel including: a photoelectric converter that generates an electric signal through photoelectric conversion of incident light; a first transistor that has a gate coupled to the photoelectric converter and that amplifies the electric signal; and a second transistor that has a gate coupled to the photoelectric converter, one of a source and a drain of the second transistor being coupled to the photoelectric converter. The imaging device further includes a voltage supply circuit configured to supply two or more
(Continued)

different voltages to the other of the source and the drain of the second transistor.

21 Claims, 33 Drawing Sheets

Related U.S. Application Data continuation of application No. 14/965,687, filed on Dec. 10, 2015, now Pat. No. 10,141,364.

(51) Int. Cl.
*H04N 5/363* (2011.01)
*H04N 5/378* (2011.01)

(56) References Cited

U.S. PATENT DOCUMENTS

| | | | |
|---|---|---|---|
| 6,532,040 B1 | 3/2003 | Kozlowski et al. | |
| 6,781,627 B1 | 8/2004 | Takayanagi | |
| 2003/0146993 A1 | 8/2003 | Kokubun et al. | |
| 2004/0196397 A1 | 10/2004 | Beck et al. | |
| 2005/0040320 A1 | 2/2005 | Lule et al. | |
| 2006/0138472 A1* | 6/2006 | Kim | H01L 27/14689 257/239 |
| 2006/0157643 A1* | 7/2006 | Bamji | G01S 17/08 250/208.1 |
| 2008/0018761 A1 | 1/2008 | Kondo et al. | |
| 2008/0067325 A1* | 3/2008 | Tani | H04N 5/3559 250/208.1 |
| 2008/0079044 A1* | 4/2008 | Wada | H04N 5/335 257/292 |
| 2008/0135895 A1 | 6/2008 | Lee et al. | |
| 2009/0140305 A1* | 6/2009 | Sugawa | H04N 5/3559 257/E31.093 |
| 2009/0303358 A1 | 12/2009 | Kawahito | |
| 2010/0163759 A1* | 7/2010 | Castagna | H01L 31/18 250/552 |
| 2013/0214128 A1* | 8/2013 | Yamashita | H04N 5/37457 250/208.1 |
| 2013/0222584 A1 | 8/2013 | Aoki et al. | |
| 2014/0002701 A1 | 1/2014 | Koifman | |
| 2014/0027618 A1 | 1/2014 | Goto | |
| 2014/0339399 A1* | 11/2014 | Sanson | H03F 3/087 250/214 A |
| 2015/0042566 A1* | 2/2015 | Lim | G06F 3/0304 345/166 |
| 2015/0124132 A1* | 5/2015 | Mabuchi | H04N 5/35581 348/296 |
| 2015/0146061 A1 | 5/2015 | Ishii | |
| 2015/0281684 A1* | 10/2015 | Beck | H04N 5/3698 348/175 |

FOREIGN PATENT DOCUMENTS

| | | |
|---|---|---|
| JP | 2001-177084 A | 6/2001 |
| JP | 2003-234959 A | 8/2003 |
| JP | 2004-312724 A | 11/2004 |
| JP | 2008-028516 A | 2/2008 |
| JP | 2010-129705 A | 6/2010 |
| JP | 2012-151369 A | 8/2012 |
| JP | 2013-030820 A | 2/2013 |
| JP | 2014-078870 A | 5/2014 |
| JP | 2014-236422 A | 12/2014 |
| WO | 2008/016049 A1 | 2/2008 |
| WO | 2012/132099 A1 | 10/2012 |
| WO | 2014/024348 A1 | 2/2014 |

OTHER PUBLICATIONS

Non-Final Office Action dated Jul. 20, 2017 in U.S. Appl. No. 14/965,687.
Final Office Action dated Oct. 26, 2017 in U.S. Appl. No. 14/965,687.
Non-Final Office Action dated Mar. 5, 2018 in U.S. Appl. No. 14/965,687.
Notice of Allowance dated Jul. 18, 2018 in U.S. Appl. No. 14/965,687.
English Translation of Chinese Search Report dated Jun. 27, 2019 for the related Chinese Patent Application No. 201510828816.8.
Non-Final Office Action issued in U.S. Appl. No. 16/161,903, dated Oct. 24, 2019.
Notice of Allowance issued in U.S. Appl. No. 16/161,903, dated Feb. 5, 2020.

* cited by examiner

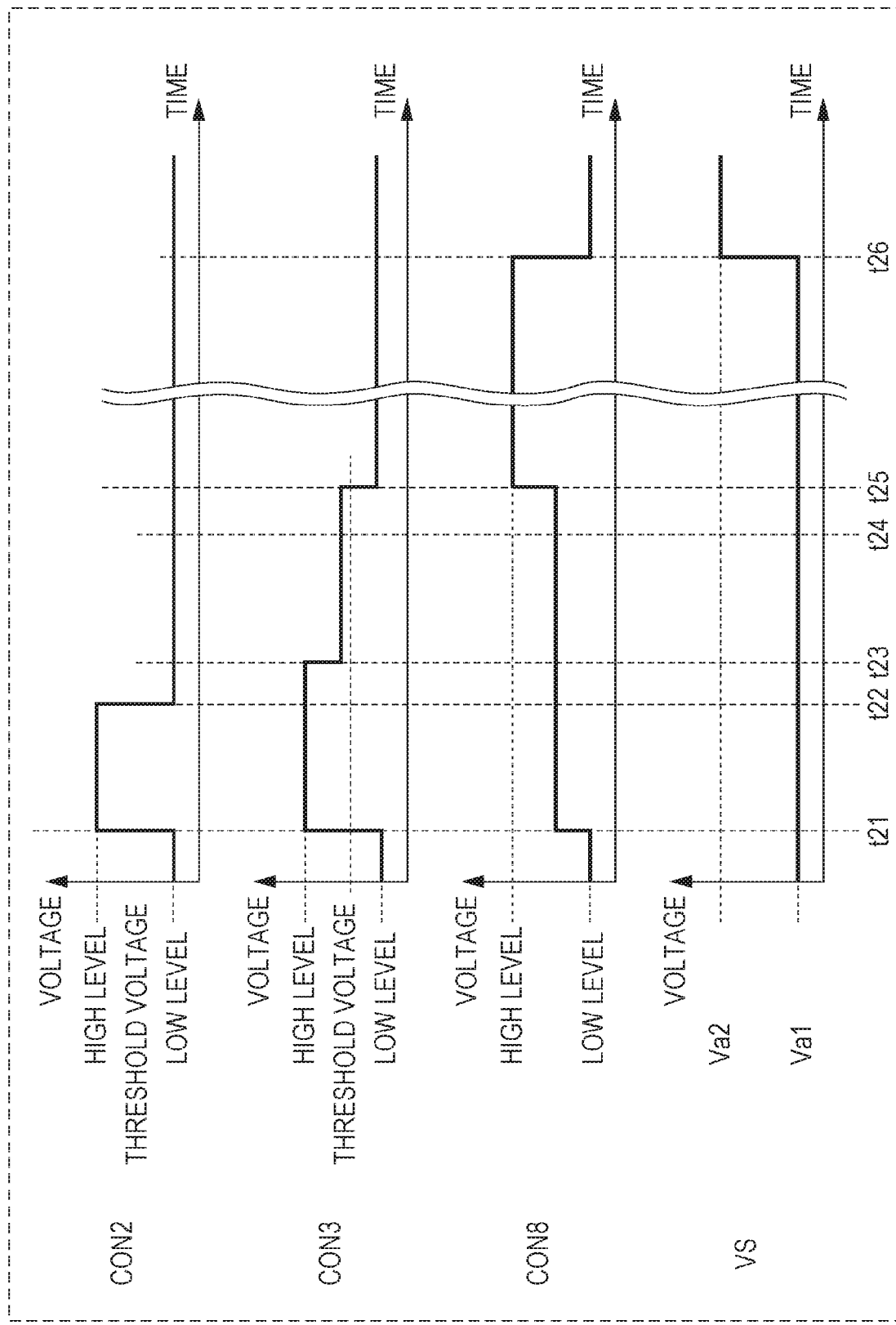

IMAGING DEVICE INCLUDING UNIT PIXEL CELL

RELATED APPLICATIONS

This application is a continuation application of U.S. patent application Ser. No. 16/161,903, filed on Oct. 16, 2018, which is a continuation application of U.S. patent application Ser. No. 14/965,687 filed Dec. 10, 2015, now U.S. Pat. No. 10,141,364, which in turn claims priority from Japanese patent application JP 2014-264696 filed on Dec. 26, 2014, and Japanese patent application JP 2015-207303 filed on Oct. 21, 2015, the contents of each is hereby incorporated by reference their entirety.

BACKGROUND

1. Technical Field

The present disclosure relates to an imaging device.

2. Description of the Related Art

In recent years, imaging devices have been widely used in the fields of various products, such as video cameras, digital still cameras, security cameras, and vehicle-mounted cameras. The imaging devices are implemented by charge-coupled device (CCD) solid-state imaging devices or complementary metal-oxide semiconductor (CMOS) solid-state imaging devices. Of the devices, the CMOS solid-state imaging devices are mainly used. Since CMOS solid-state imaging devices can be manufactured using a general CMOS process, existing facilities can be used, and thus imaging devices can be stably supplied. In addition, since peripheral circuitry can be incorporated into the same chip, signals can be read from the imaging devices at high speed, thus making it possible to achieve a higher speed and a higher resolution. Thus, CMOS solid-state imaging devices have many advantages.

For example, correlated double sampling (CDS) like that disclosed in Japanese Unexamined Patent Application Publication No. 2010-129705 (hereinafter referred to as "Patent Document 1") is widely used in CMOS solid-state imaging devices.

SUMMARY

In the field of imaging devices, noise reduction is required. In particular, reduction of kTC noise generated during resetting (also called "reset noise") is required.

One non-limiting and exemplary embodiment provides an imaging device that can effectively suppress reset noise.

In one general aspect, the techniques disclosed here feature an imaging device having a pixel including; a photoelectric converter that generates an electric signal through photoelectric conversion of incident light; a first transistor that has a gate coupled to the photoelectric converter and that amplifies the electric signal; and a second transistor that has a gate coupled to the photoelectric converter, one of a source and a drain of the second transistor being coupled to the photoelectric converter. The imaging device further includes a voltage supply circuit configured to supply two or more different voltages to the other of the source and the drain of the second transistor.

It should be noted that general or specific embodiments may be implemented as a system, a method, an integrated circuit, a computer program, a storage medium, or any selective combination thereof. Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 20 is a timing chart illustrating one example of the operation of the reading circuit;

DETAILED DESCRIPTION

Before a description is given of embodiments of the present disclosure, typical CDS will first be described with reference to FIGS. 1 and 2.

Figure 1:
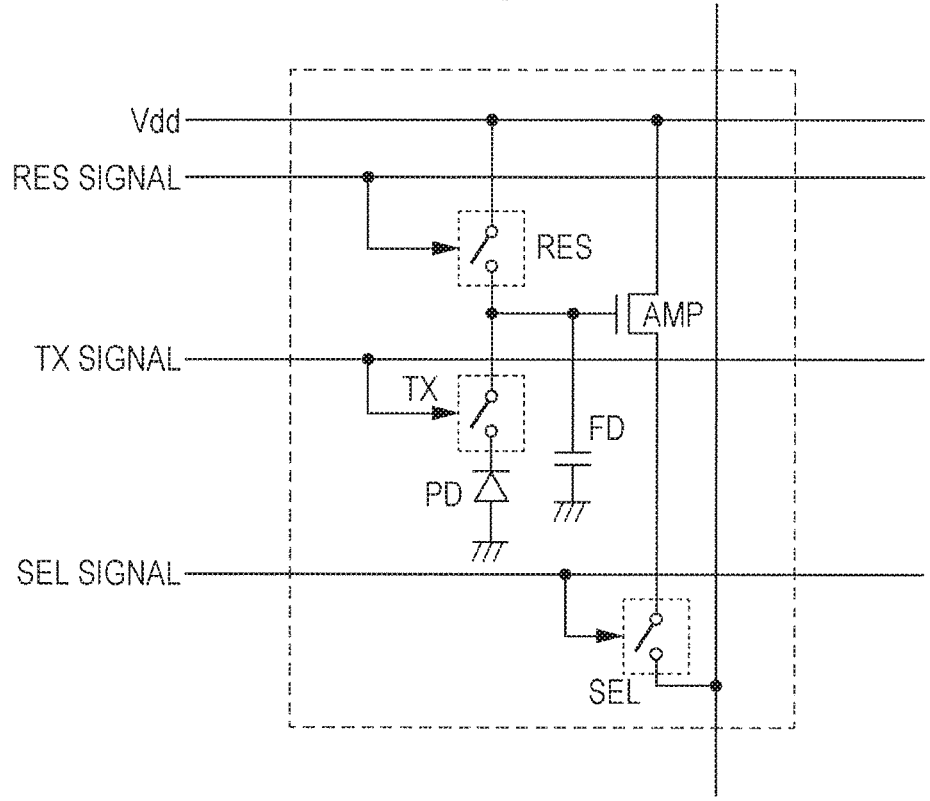
FIG. 1 is a schematic diagram illustrating a pixel circuit in a typical imaging device.

FIG. 1 illustrates a typical pixel circuit. The pixel circuit includes a photodetector (PD) portion, a floating diffusion (FD), a transfer (TX) transistor, a reset (RES) transistor, amplification (AMP) transistor, and a selection (SEL) transistor. The PD portion detects an optical signal. The FD converts charge generated in the PD portion into a voltage signal and temporarily holds the charge. The TX transistor transfers a charge signal from the PD portion to the FD. The RES transistor resets the voltage of the FD. The AMP transistor amplifies the voltage signal of the FD. The SEL transistor outputs the amplified signal. The PD portion is typically a photodiode.

Figure 2:
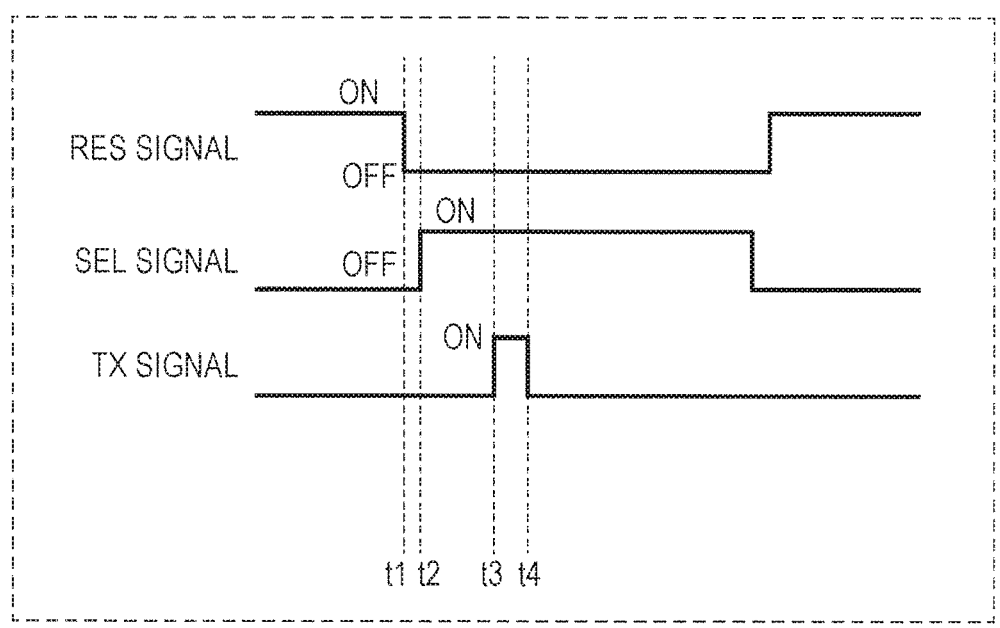
FIG. 2 is a timing chart illustrating one example of the operation of the pixel circuit in the typical imaging device.

FIG. 2 is a timing chart illustrating one example of the operation of the pixel circuit disclosed in Patent Document 1. At time t1, an RES signal is set to a low level, so that the RES transistor is turned off. At time t2, the SEL signal is set to a high level, so that the SEL transistor is turned on, and a reset voltage is output. When the SEL transistor is turned on, the reset voltage contains kTC noise, and thus, fluctuations over time occur in signals. Thereafter, at time t3, a TX signal is set to a high level, so that the TX transistor is turned on. As a result, the signal charge accumulated in the PD portion is transferred to the FD. Next, at time t4, the TX signal is set to a low level, so that the TX transistor is turned off. As a result, the signal voltage is determined. The determined signal voltage is a signal that has changed relative to the reset voltage by an amount corresponding to a voltage according to the accumulated signal charge. Thus, in a circuit at a subsequent stage, it is possible to detect only a voltage corresponding to the accumulated signal charge and to thereby cancel the kTC noise, by obtaining a difference between the reset voltage and the signal voltage.

In such a manner, according to the CDS, it is possible to significantly reduce kTC noise generated during resetting each unit pixel cell. This is one reason why CMOS solid-state imaging devices have been mainly used.

The following description will be given of problems of the above-described related art which have been found by the present inventor.

All signal charge generated in the PD portion, which detects an optical signal, is transferred to the FD. This transfer is herein referred to as "complete transfer". In order to realize the complete transfer, there are problems in that, for example, the manufacturing process is complicated and the manufacturing cost increases.

Also, a solid-state imaging device that is capable of performing non-distortion image capture on an object moving at high speed, has been proposed recently. For example, Japanese Unexamined Patent Application Publication No. 2008-28516 (herein referred to as "Patent Document 2") discloses a solid-state imaging device having unit pixel cells that realize a global shutter.

In the solid-state imaging device in Patent Document 2, charges in PD portions in all unit pixel cells are transferred to FDs at a time. Thereafter, a signal voltage is sequentially read for each row. Consequently, reset voltages cannot be read before signal voltages in the FDs are read. Thus, when CDS is applied to the solid-state imaging device in Patent Document 2, the signal voltages in the FDs are read, then the FDs are reset, the reset voltages are read, and a difference between the signal voltage and the reset voltage is obtained. In this case, however, reset noise contained in the signal voltage and reset noise contained in the reset voltage has no correlation, it is difficult to remove the reset noise. Consequently, even when CDS is applied to the solid-state imaging device in Patent Document 2, random noise increases, compared with the above-described reading using the CDS.

Nowadays, the area per unit pixel cell decreases as a result of an increase in the number of unit pixel cells, and the area of the PD portion tends to decrease. Consequently, the sensitivity may decline. Solid-state imaging devices that overcome this problem have also been proposed. For example, Japanese Unexamined Patent Application Publication No. 2014-78870 (Patent Document 3) discloses an organic CMOS sensor in which an organic photoelectric conversion layer is used in a PD portion. According to the organic CMOS sensor, the organic photoelectric conversion layer, which serves as a light receiving portion, is provided above a reading circuit. Thus, even when the pixel size decreases, the area of the light receiving portion can be increased. This makes it possible to realize a high sensitivity.

In organic CMOS sensors, since the PD portion and a semiconductor layer are electrically connected through a metal wire, the signal charge cannot be completely transferred. Accordingly, a typical method that has been employed is a method in which the PD portion and the FD are electrically connected to read a voltage due to signal charge accumulated in the PD portion. This can suppress noise and afterimage generation due to the incomplete transfer.

Specifically, the voltage of the FD varies depending on the amount of signal charge accumulated in the FD during exposure. The voltage of the FD when the signal charge is accumulated is read as a signal voltage. Thereafter, the signal charge accumulated in the FD is reset, and the voltage of the FD at this point in time is read as a reset voltage. Then, the difference between the signal voltage and the reset voltage is obtained.

In this case, however, there is no correlation between reset noise contained in the reset voltage and reset noise contained in the signal voltage. Thus, the reset noise cannot be eliminated. Consequently, the amount of random noise increases, compared with the above-described reading using the above-described CDS.

In view of such problems, the present inventor has conceived an imaging device having a novel structure. An overview of one aspect of the present disclosure will be described as the following items.

[Item 1] An imaging device comprising a unit pixel cell comprising: a photoelectric converter that generates an electric signal through photoelectric conversion of incident light; and a signal detection circuit that detects the electric signal, the signal detection circuit comprising a first transistor that amplifies the electric signal, a second transistor that selectively transmits output of the first transistor to outside of the unit pixel cell, and a feedback circuit that forms a feedback loop through which the electric signal is negatively fed back, the feedback loop not passing through the first transistor.

According to this configuration, the reset noise can be suppressed effectively.

[Item 2] In the imaging device according to item 1, the first transistor may be provided out of the feedback loop.

[Item 3] An imaging device comprising a unit pixel cell comprising: a photoelectric converter that generates an electric signal through photoelectric conversion of incident light; and a signal detection circuit that detects the electric signal, the signal detection circuit comprising a first transistor that amplifies the electric signal, a second transistor that selectively transmits output of the first transistor to outside of the unit pixel cell, and a feedback circuit that forms a feedback loop through which the electric signal is negatively fed back, the feedback loop passing through the first transistor, the feedback circuit comprising a third transistor provided on the feedback loop, a gate of the third transistor being connected to a voltage control circuit that outputs at least three voltages different from each other.

According to this configuration, the reset noise can be suppressed effectively.

[Item 4] In the imaging device according to item 3, the first transistor may be provided on the feedback loop.

[Item 5] The imaging device according to item 3 or 4 may further comprise a constant current source provided on an output side of the first transistor.

According to this configuration, it is possible to increase the band of the first transistor (an amplification transistor), and it is possible to perform noise suppression at high speed.

[Item 6] In the imaging device according to one of items 1 to 5, the signal detection circuit may further comprise a reset transistor that initializes the electric signal.

According to this configuration, it is possible to initialize the electric signal in the photoelectric converter, and it is possible to suppress the reset noise at high speed.

[Item 7] In the imaging device according to one of items 1 to 5, the signal detection circuit may amplify the electric signal with a first amplification factor in a period when the feedback circuit forms the feedback loop, and the signal detection circuit may amplify the electric signal with a second amplification factor different from the first amplification factor in a period when the feedback circuit does not form the feedback loop.

According to this configuration, it is possible to improve a noise suppression ratio during noise suppression, and it is possible to perform a stable operation during reading.

[Item 8] In the imaging device according to item 6, the reset transistor may be provided on the feedback loop.

According to this configuration, the reset noise can be effectively suppressed with a small area and at high speed.

[Item 9] In the imaging device according to item 8, the reset transistor may function as a negative feedback transistor.

According to this configuration, the reset noise can be effectively suppressed with a small area and at high speed.

[Item 10] In the imaging device according to one of items 1 to 9, the feedback circuit may comprise a first capacitor and a second capacitor connected in series to the first capacitor, and the first capacitor and the second capacitor may be provided between the photoelectric converter and a reference voltage.

According to this configuration, the reset noise can be suppressed more effectively.

[Item 11] In the imaging device according to item 10, the first capacitor may be provided on the feedback loop.

According to this configuration, the reset noise can be suppressed more effectively.

[Item 12] In the imaging device according to item 10, the first capacitor may have a first capacitance value, and the second capacitor may have a second capacitance value larger than the first capacitance value.

According to this configuration, the capacitance of the second capacitor is increased as long as the area permits, so that the reset noise can be suppressed more efficiently.

[Item 13] In the imaging device according to item 6, one end of the reset transistor may be connected to the photoelectric converter without forming a part of the feedback loop of the feedback circuit.

According to this configuration, a signal in the photoelectric converter can be reset to an arbitrary level.

[Item 14] In the imaging device according to items 6 and 13, one end of the reset transistor may be connected to an output end of the first transistor.

According to this configuration, the signal in the photoelectric converter can be reset by an output signal of the first transistor without provision of a reference voltage. Since changes in the signal in the photoelectric converter before and after the reset transistor is turned off can be reduced, it is possible to perform noise suppression at higher speed.

[Item 15] The imaging device according to items 6 and 13 may further have a band control transistor that controls a band of the feedback circuit. The band control transistor may form a part of the feedback loop of the feedback circuit, and one end of the reset transistor may be connected to the band control transistor.

According to this configuration, the signal in the photoelectric converter can be reset by an output signal of the band control transistor without provision of a reference voltage. Since changes in the signal in the photoelectric converter before and after the reset transistor is turned off can be reduced, it is possible to perform noise suppression at higher speed.

[Item 16] The imaging device according to one of items 1 to 5 may further have a signal reading line connected to the second transistor, and the second transistor may further have a first period in which an output end of the first transistor and the signal reading line are electrically disconnected from each other and a second period in which an output end of the first transistor and the signal reading line are electrically connected to each other.

According to this configuration, since the output end of the first transistor and the signal reading line are not connected in the first period, it is possible to perform high-speed noise cancelling without depending on the time constant of the reading line.

[Item 17] The imaging device according to one of items 1 to 5 may further have a band control transistor that controls a band of the feedback circuit. The band control transistor may be controlled so as to continuously change from an arbitrary first band to an arbitrary second band.

According to this configuration, stable noise cancelling can be performed.

[Item 18] A camera system has an imaging device according to one of items 1 to 17, an optical system that forms a subject image on the imaging device, and a signal processor that processes a signal output from the imaging device.

According to this camera system, the reset noise during reading can be appropriately suppressed, and a favorable image can be acquired.

Embodiments of the present disclosure will be described below with reference to the accompanying drawings. It is to be noted that the present disclosure is not limited to the embodiments described below. Changes are also possible within a scope that does not depart from a scope in which advantages of the present disclosure are obtained. In addition, one embodiment can be combined with another embodiment. In the following description, the same or similar constituent elements are denoted by the same reference numerals. A redundant description may also be omitted.

In first to fifth embodiments described below, it is assumed that transistors, except for some transistors, in a signal reading circuit are, in principle, n-channel metal-oxide semiconductor (NMOS) transistors. Naturally, p-channel metal-oxide semiconductor (PMOS) transistors may be used in place of the NMOS transistors. In such a case, the polarity of each control signal is inverted. NMOS transistors and PMOS transistors may also be used in combination.

First Embodiment

The structure, functions, and a drive method of an imaging device 100 according to a first embodiment will be described with reference to FIGS. 3 to 8. The imaging device 100 according to the present embodiment has reading circuits 50A, each including three transistors.
(Structure of Imaging Device 100)

First, the structure of the imaging device 100 will be described with reference to FIG. 3.

Figure 3:
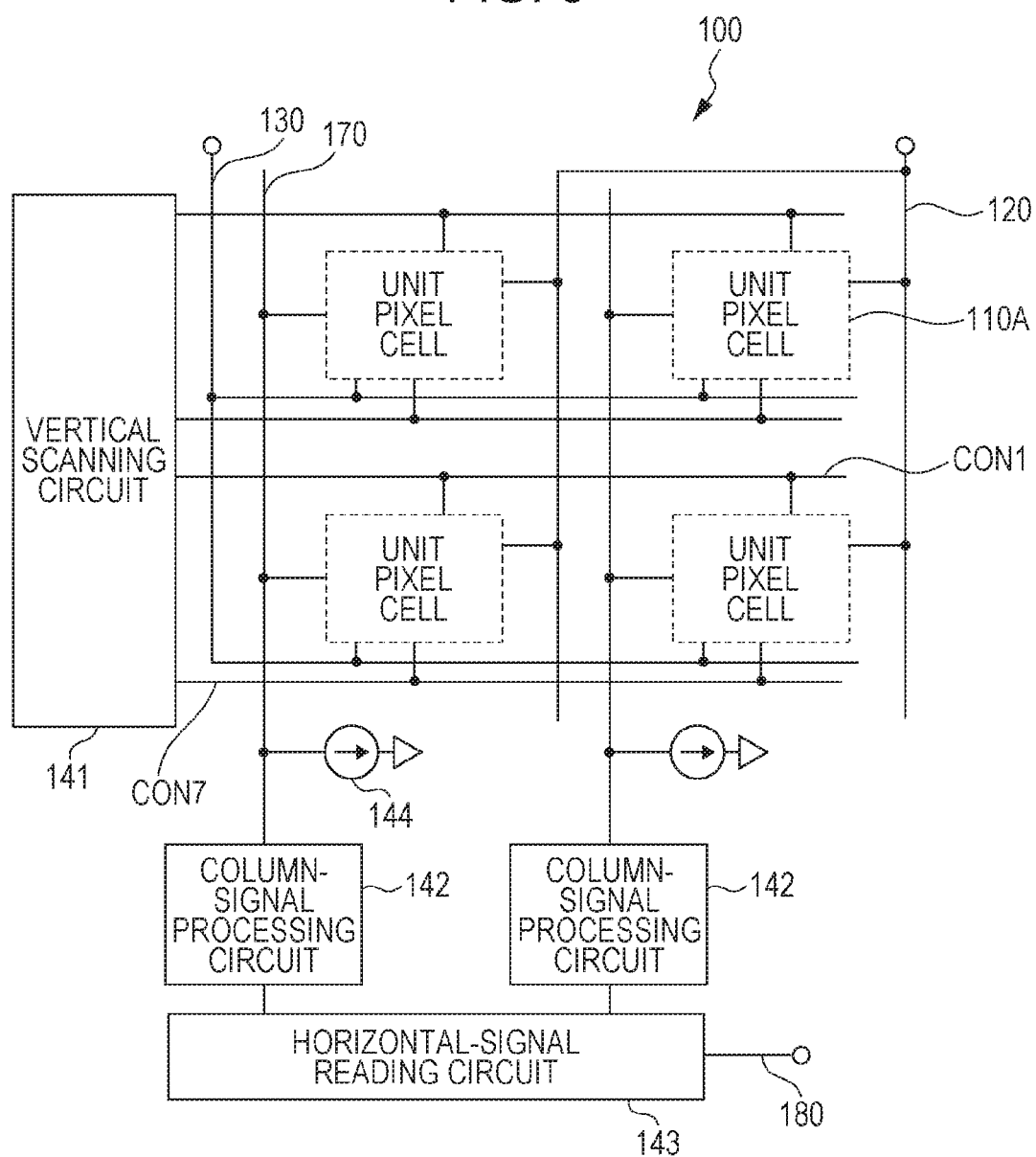
FIG. 3 is a schematic diagram illustrating an exemplary circuit configuration of an imaging device according to a first embodiment.

FIG. 3 schematically illustrates an exemplary circuit configuration of the imaging device 100 according to the present embodiment. The imaging device 100 is, for example, a stack-type imaging device and has a photoelectric conversion layer stacked on a semiconductor substrate. The imaging device 100 has a plurality of unit pixel cells 110A and peripheral circuitry.

The unit pixel cells 110A are two dimensionally arranged to form a photosensitive area (pixel area). The unit pixel cells 110A may also be arranged one dimensionally. In this case, the imaging device 100 may be a line sensor.

In the illustrated example, the unit pixel cells 110A are arranged in a row direction and a column direction. The "row direction" and the "column direction" as used herein refer to directions in which a row and a column extend, respectively. That is, in the drawings, the perpendicular direction (the up-and-down direction) corresponds to column direction, and the horizontal direction (the left-and-right direction) corresponds to the row direction.

The unit pixel cells 110A are connected to a power-supply wire 120. A predetermined power-supply voltage is supplied to the unit pixel cells 110A through the power-supply wire 120. The imaging device 100 has a photoelectric conversion layer for photoelectrically converting incident light. The same constant voltage is supplied to the entire photoelectric conversion layer through an accumulation control line 130. However, when control for suppressing variations or the like is performed, different voltages may be supplied to respective areas obtained by dividing the photoelectric conversion layer. A detailed description of the unit pixel cells 110A is given later.

The peripheral circuitry includes a vertical scanning circuit (also called a "row scanning circuit") 141, column-signal processing circuits (also called "row-signal accumulation circuits") 142, a horizontal-signal reading circuit (also called a "column scanning circuit") 143, and constant current sources 144. One column-signal processing circuit 142 and one constant current source 144 may be arranged for each column of the two-dimensionally arranged unit pixel cells 110A.

One example of the configuration of the peripheral circuitry will be described below.

The vertical scanning circuit 141 is connected to selection control signal lines (address signal lines) CON7 and band control signal lines CON1. The vertical scanning circuit 141 applies a predetermined voltage to each selection control signal line CON7 to thereby select, row by row, the unit pixel cells 110A arranged in each row. Then, signal voltages of the selected the unit pixel cells 110A are read, and pixel electrodes described below are reset.

The unit pixel cells 110A arranged in each column are electrically connected to the column-signal processing circuit 142 through a vertical signal line 170 corresponding to the column. The column-signal processing circuits 142 perform, for example, noise-suppression signal processing typified by correlated double sampling (CDS) and analog-to-digital (A/D) conversion. The column-signal processing circuits 142 are connected to the horizontal-signal reading circuit 143. The horizontal-signal reading circuit 143 reads signals from the column-signal processing circuits 142 and outputs signals to a horizontal common signal line 180.

Next, the structure of each unit pixel cell 110A will be described in detail with reference to FIGS. 4 to 6.

Figure 4:
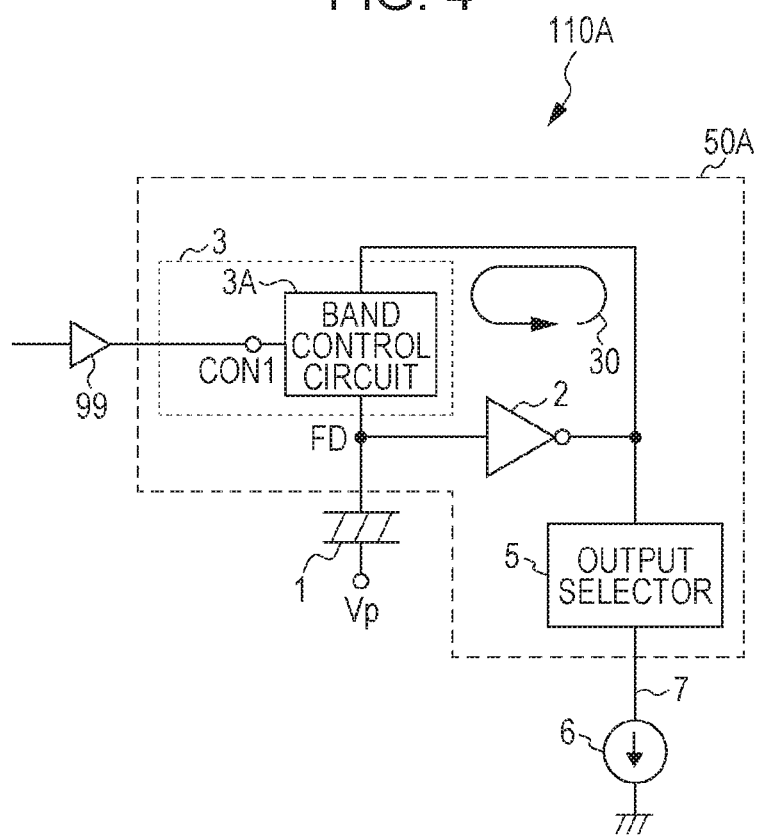
FIG. 4 is a schematic diagram illustrating an exemplary circuit configuration of each unit pixel cell in the imaging device according to the first embodiment.

FIG. 4 schematically illustrates an exemplary circuit configuration of each unit pixel cell 110A in the imaging device 100 according to the present embodiment. The unit pixel cell 110A includes a photodetector 1, an amplifier 2, a band controller 3, a charge accumulator, and an output selector 5. The photodetector 1 detects light to generate signal charge. Herein, the photodetector 1 may be referred to as a "photoelectric converter". The charge accumulator includes a node in which the signal charge generated by the photodetector 1 is accumulated. This charge accumulator is hereinafter referred to as an "FD".

The amplifier 2, the band controller 3, the FD, and the output selector 5 constitute a reading circuit 50A. The photodetector 1 converts light into signal charge. The reading circuit 50A reads the signal charge generated by the photodetector 1.

Figure 5A:
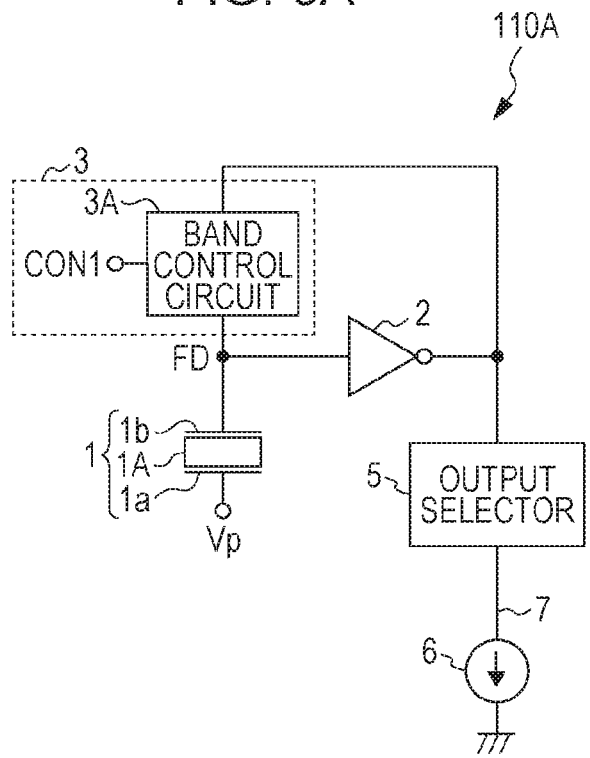
FIG. 5A is a schematic diagram illustrating an example of the configuration of a photodetector.
Figure 5B:
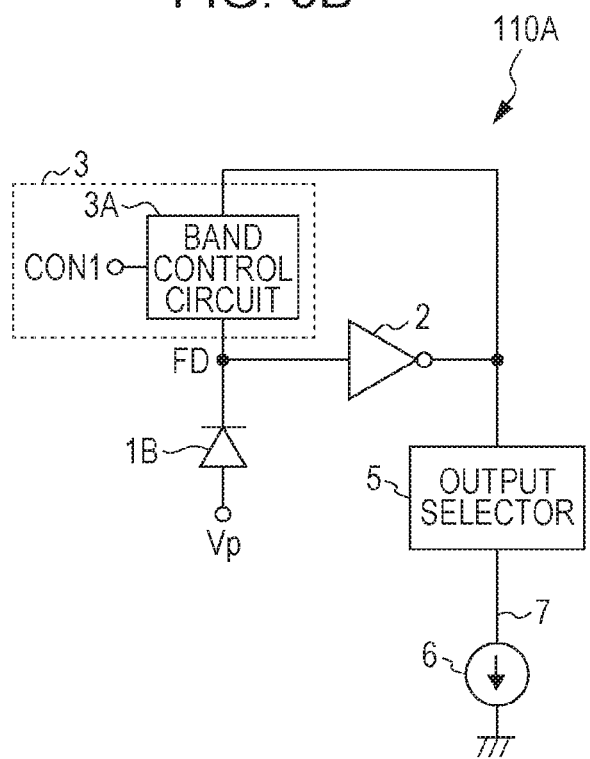
FIG. 5B is a schematic diagram illustrating an example of the configuration of the photodetector.

Each of FIGS. 5A and 5B illustrates one example of the photodetector 1. The photodetector 1 may be constituted by, for example, an upper electrode 1a, a lower electrode 1b, and an organic photoelectric conversion layer 1A interposed therebetween, as illustrated in FIG. 5A. When a reference voltage Vp is applied to the upper electrode 1a, and one end of a node which forms the FD is connected to the lower electrode 1b, signal charge generated by the photodetector 1 can be accumulated in the FD. As illustrated in FIG. 5B, the photodetector 1 may be implemented by a photodiode 1B. When a ground voltage or the reference voltage Vp is applied to one end of the photodiode 1B, and one end of the node which forms the FD is connected to another end of the photodiode 1B, signal charge generated by the photodetector 1 can be accumulated in the FD. The photodetector 1 may be another element having a photoelectric conversion function.

A reference is made to FIG. 4 again. The FD is connected to the photodetector 1 via a wiring layer. The FD accumulates the signal charge generated by the photodetector 1. The FD is further connected to an input end of the amplifier 2. The amplifier 2 amplifies a signal corresponding to the signal charge accumulated in the FD and outputs the amplified signal to the band controller 3 and the output selector 5.

The amplifier 2 and the band controller 3 form a loop (a feedback circuit) 30 via the FD. The band controller 3 includes a band control circuit 3A. At least three voltages that are different from one another are supplied from a voltage control circuit 99 to the band control circuit 3A. Since such voltages are supplied to the band control circuit 3A, it has a band control function. The band control circuit 3A applies band limitation to the signal output from the amplifier 2 and outputs the resulting signal to the FD. In the feedback circuit 30, the signal read from the FD is amplified by the amplifier 2, the amplified signal is subjected to the band limitation by the band control circuit 3A, and the resulting signal is fed back to the FD.

The output selector 5 is connected to a signal reading line 7. The signal reading line 7 is shared by at least two unit pixel cells. The signal amplified by the amplifier 2 is output to the signal reading line 7 via the output selector 5. The signal reading line 7 corresponds to the vertical signal line 170 illustrated in FIG. 3. A constant current source 6 corresponds to the constant current source 144 illustrated in FIG. 3.

The structure and functions of the reading circuit 50A will be described in detail with reference to FIG. 6.

Figure 6:
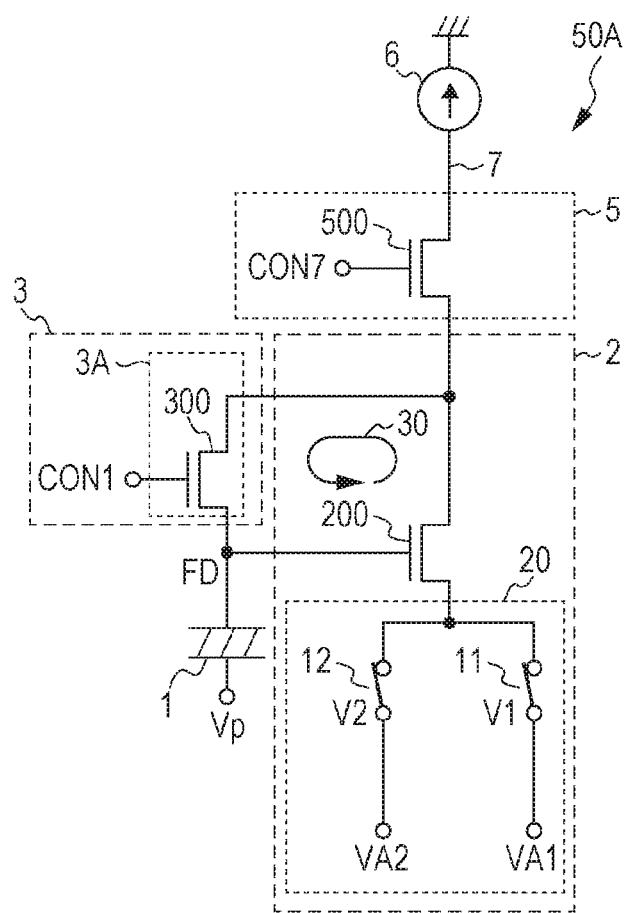
FIG. 6 is a schematic diagram illustrating an exemplary circuit configuration of a reading circuit according to the first embodiment.

FIG. 6 schematically illustrates the circuit configuration of the reading circuit 50A. The feedback circuit 30 negatively feeds back a signal, which is input from the photodetector 1, to the FD via a first amplification transistor 200.

The amplifier 2 has the first amplification transistor 200 and a switching circuit 20, which includes a first switching element 11 and a second switching element 12. It is assumed that transistors in the reading circuit 50A are NMOS transistors. The following description will be given of a relationship of electrical connections in the reading circuit 50A.

The FD is connected to the gate of the first amplification transistor 200. The band controller 3 includes a first band control transistor 300. The output selector 5 includes a first selection transistor 500. One of the source and the drain of the first amplification transistor 200 is connected to one of the source and drain of the first band control transistor 300 and to one of the source and the drain of the first selection transistor 500. Also, the other of the source and the drain of the first band control transistor 300 is connected to the FD. The first band control transistor 300 and a capacitance component that is parasitic in the FD form a resistor-capacitor (RC) filter circuit.

The band control signal line CON1 is connected to the gate of the first band control transistor 300. The state of the first band control transistor 300 is determined by the voltage of the band control signal line CON1. For example, when the voltage of the band control signal line CON1 is at a high level, the first band control transistor 300 is turned on. As a result, the FD, the first amplification transistor 200, and the first band control transistor 300 form a feedback loop.

When the voltage of the band control signal line CON1 decreases, resistance components of the first band control transistor 300 increase. Consequently, the bandwidth of the first band control transistor 300 decreases, and the frequency range of a signal that is fed back decreases. When the voltage of the band control signal line CON1 reaches a low level, which is lower than the previous level, the first band control transistor 300 is turned off. As a result, no feedback loop is formed.

The other of the source and the drain of the first selection transistor 500 is connected to the signal reading line 7. The gate of the first selection transistor 500 is controlled through the selection control signal line CON7. The state of the first selection transistor 500 is determined by the voltage of the selection control signal line CON7. For example, when the voltage of the selection control signal line CON7 is at a high level, the first selection transistor 500 is turned on. As a result, the first amplification transistor 200 and the signal reading line 7 are electrically connected to each other. When the voltage of the selection control signal line CON7 is at a low level, the first selection transistor 500 is turned off. As a result, the first amplification transistor 200 and the signal reading line 7 are electrically isolated from each other.

The switching circuit 20 is connected to the other of the source and the drain of the first amplification transistor 200. More specifically, the other of the source and the drain of the first amplification transistor 200 is connected to a first voltage source VA1 via the first switching element 11. The other of the source and the drain of the first amplification transistor 200 is also connected to a second voltage source VA2 via the second switching element 12. The switching circuit 20 is controlled with control signals V1 and V2 to thereby switch the voltage, applied to the other of the source and the drain of the first amplification transistor 200, between a voltage Va1 and a voltage Va2. The voltage Va1 of the first voltage source VA1 is, for example, a ground voltage GND. The voltage Va2 of the second voltage source VA2 is, for example, a power-supply voltage VDD. The switching circuit 20 may be provided for each unit pixel cell or may be shared by a plurality of unit pixel cells in order to reduce the number of elements per unit pixel cell.

The constant current source 6 is connected to the signal reading line 7. When the first selection transistor 500 is on, the first selection transistor 500, the first amplification transistor 200, and the constant current source 6 form a source follower circuit. A signal corresponding to the signal charge accumulated in the FD is output to the signal reading line 7 and is read to outside. The constant current source 6 may be provided for each unit pixel sell or may be shared by a plurality of unit pixel cells in order to reduce the number of elements per unit pixel cell.

(Operation of Imaging Device 100)

Next, an operation flow of the reading circuit 50A will be described with reference to FIG. 7.

Figure 7:
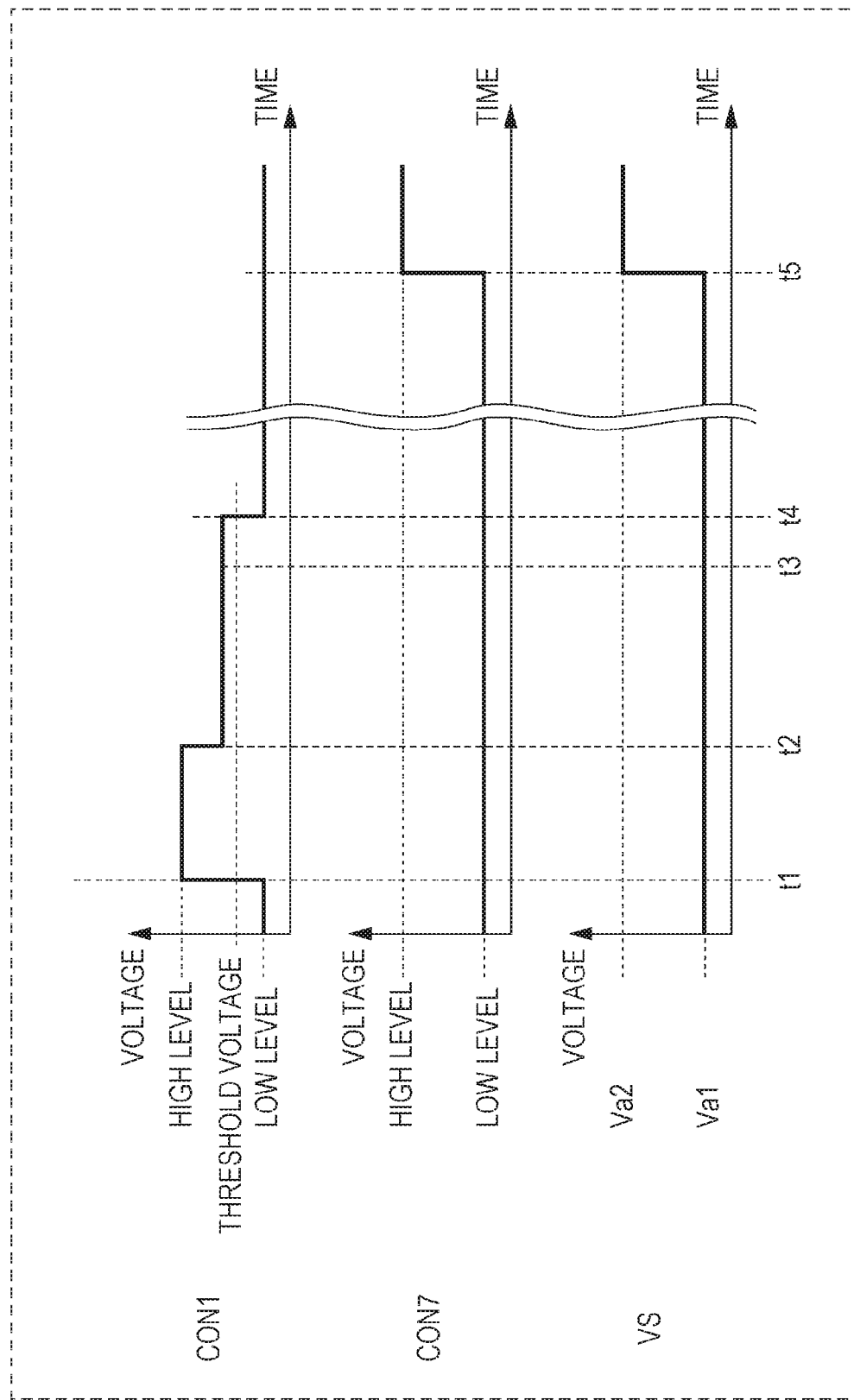
FIG. 7 is a timing chart illustrating one example of the operation of the reading circuit.

FIG. 7 is a timing chart illustrating one example of the operation of the reading circuit 50A. The horizontal axis in each graph represents time, and the vertical axes represent a voltage of the band control signal line CON1, a voltage of the selection control signal line CON7, and a voltage VS of the other of the source and the drain of the first amplification transistor 200 sequentially from the top in FIG. 7.

(Reset Period)

At time t1, the voltage of the selection control signal line CON7 is at a low level. Thus, the first selection transistor 500 is in an off state, so that the first amplification transistor 200 and the signal reading line 7 are electrically isolated from each other. Also, at time t1, the voltage of the band control signal line CON1 is set to a high level to put the first band control transistor 300 into an on state. Also, at time t1, the first switching element 11 in the switching circuit 20 is in an on state, and the voltage Va1 (e.g., GND) is applied to the other of the source and the drain of the first amplification transistor 200. As a result, the voltage of the FD becomes equal to a reset voltage VRST.

In this case, the voltage of the band control signal line CON1 is set so that the operating band of the first band control transistor 300 is a first band, which is a wideband. This allows the voltage of the FD to be equal to the reset voltage VRST at high speed. The first band means the operating band of the first band control transistor 300 which corresponds to a gate voltage at a high level. It should be noted that a frequency band of a signal passing between a source and a drain of a transistor is referred to as an operating band of the transistor.

In the present embodiment, this reset period is provided in order to set the FD to have the reset voltage at high speed. However, if the drive time allows extra time, an operation for setting the FD to have the reset voltage may be performed in a noise suppression period, described below, without provision of the reset period.

(Noise Suppression Period)

Next, in the period of time t2 to time t4, the voltage of the band control signal line CON1 is set to a voltage between the high level and the low level, for example, to an intermediate voltage, in this case, the operating band of the first band control transistor 300 is a second band, which is narrower than the first band. The second band means the operating band of the first band control transistor 300 when the gate voltage is an intermediate voltage.

When the second band is made to be sufficiently smaller than the operating band of the first amplification transistor 200, the noise suppression effect increases. However, the period from time t2 to time t4 increases. Even when the second band is wider than the operating band of the first amplification transistor 200, the noise suppression effect can be obtained. Hence, a designer can arbitrarily design the second band in accordance with an allowable time in the period of time t2 to time t4. The following description will be given assuming that the second band is sufficiently narrower than the operating band of the first amplification transistor 200.

When the second band is narrower than the operating band of the first amplification transistor 200, the feedback circuit reduces thermal noise generated in the first band control transistor 300. When the amplification factor of the amplifier 2 is represented by $-A$, the thermal noise can be reduced to $1/(1+A)^{1/2}$.

The switching circuit 20 is set so that the other of the source and the drain of the first amplification transistor 200 has the ground voltage GND. The designer can design the amplification factor of the amplifier 2 so that it has an optimum value for the circuit system. Typically, A is set to a numerical value of 1 or greater and may be set to a numerical value of a few 10 s to several 100 s.

When the voltage of the band control line CON1 is set to a low level at time t4 to turn off the first band control transistor 300, kTC noise that remains in the FD at this point in time is also reduced to $1/(1+A)^{1/2}$, compared with a case in which no feedback is performed.

(Exposure/Reading Period)

At time t5, the voltage of the selection control signal line CON7 is set to the high level to turn on the first selection transistor 500. Also, the switching circuit 20 is controlled so that the voltage of the other of the source and the drain of the first amplification transistor 200 reaches the voltage Va2 (e.g., VDD). That is, the second switching element 12 is turned on, the voltage Va2 is applied to the other of the source and the drain of the first amplification transistor 200. In this state, the first amplification transistor 200 and the constant current source 6 form a source follower circuit. The signal reading line 7 then has a voltage corresponding to the signal charge accumulated in the FD. At this point in time, the amplification factor of the source follower circuit is about 1.

At time t5, the voltage of the FD has changed relative to the reset voltage VRST by an amount corresponding to a voltage according to signal charge generated by the photodetector 1 in the period of time t4 to time t5. The amplifier 2 amplifies the voltage of the FD by an amplification factor of about 1, and the amplified signal is output to the signal reading line 7.

Random noise means fluctuations, that is, kTC noise, in the output signal when the signal charge generated by the photodetector 1 is 0. The kTC noise is reduced to $1/(1+A)^{1/2}$ in the noise suppression period, and further, in an exposure/reading period, the resulting signal is output to the signal reading line 7 with an amplification factor of about 1. Thus, according to the present embodiment, it is possible to obtain favorable image data in which the random noise is reduced.

In addition, according to the present embodiment, CDS can also be performed in order to cancel variations in the peripheral circuitry. Specifically, after the source follower circuit reads the signal voltage of the FD, the above-described reset operation is performed again. After the reset operation is completed, the source follower circuit performs the reading operation again before the photodetector 1 detects light. Thus, the reset voltage VRST can be read. It is possible to perform CDS by obtaining the difference between the signal voltage of the FD and the reset voltage.

In the present embodiment, since the source follower circuit reads the signal in the FD in the exposure period, the amplification factor is about 1. The present disclosure, however, is not limited to this amplification factor, and the designer may vary the amplification factor in accordance with a signal-to-noise ratio (SNR) or a circuit range needed for the system.

In the present embodiment, feedback for noise cancelling is performed in each unit pixel cell of the unit pixel cells 110A. This allows the noise cancelling to be performed at high speed without being affected by the time constant of the signal reading line 7.

Lastly, another control method for the band control signal line CON1 will be described with reference to FIG. 8.

Figure 8:
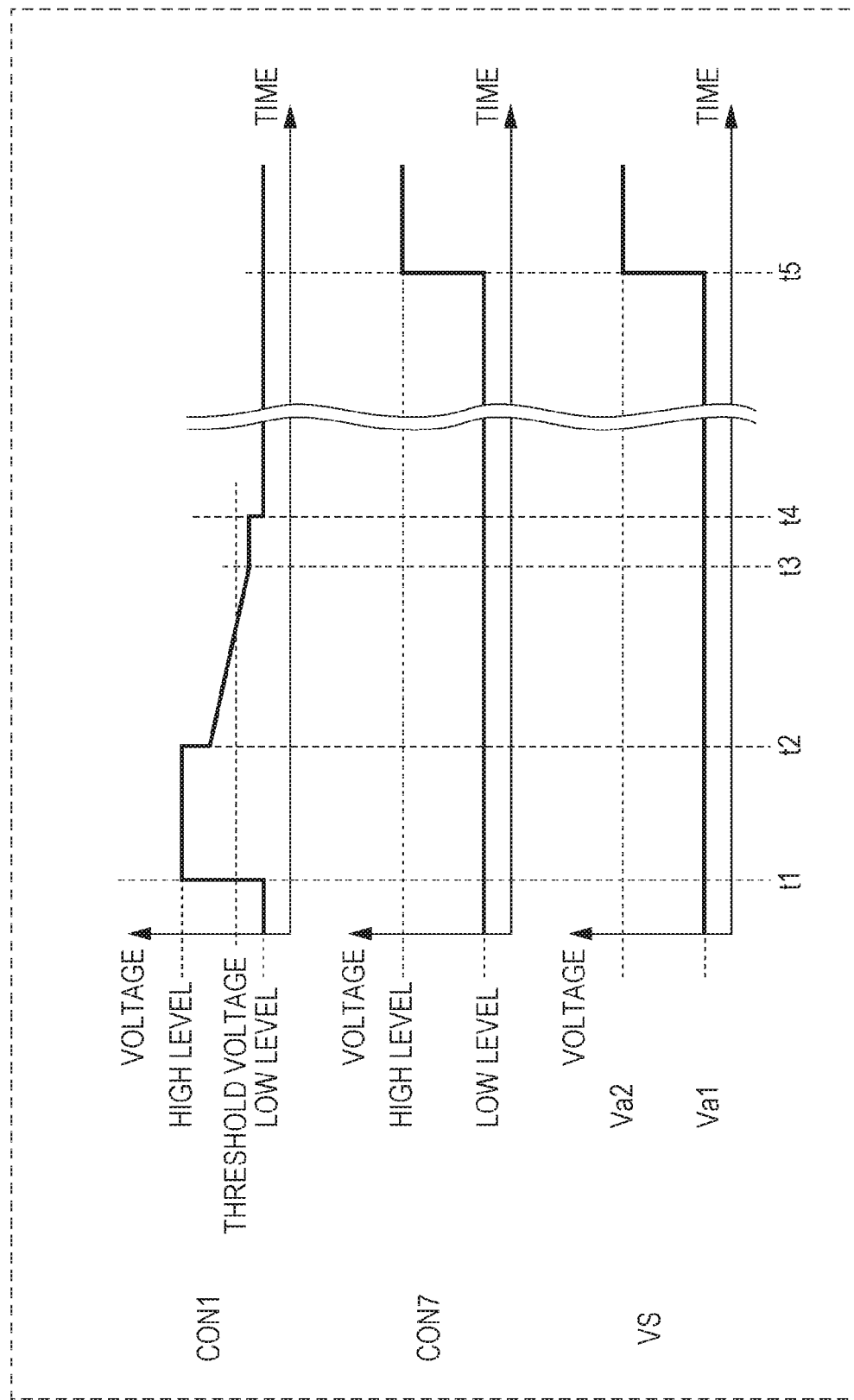
FIG. 8 is a timing chart illustrating another example of the operation of the reading circuit.

FIG. 8 is a timing chart illustrating another example of the operation of the reading circuit 50A. As illustrated in FIG. 8, the band control signal line CON1 may be controlled so that the first band control transistor 300 changes gradually from the on state to the off state across a threshold voltage for the first band control transistor 300. Herein, such reset control is referred to as "taper reset".

With the taper reset, even when the threshold voltages of the first band control transistors 300 in the unit pixel cells 110A in the imaging device 100 have variations, noise generated in all of the unit pixel cells 110A can be effectively suppressed. Also, a variation range of the voltage applied to the band control signal line CON1 during the taper reset may be limited to a variation range of threshold voltages of the first band control transistors 300 in the unit pixel cells 110A. This makes it possible to reduce the time taken for the taper reset and makes it possible to perform the noise suppression at high speed.

Second Embodiment

The structure, functions, and a drive method of an imaging device 100 according to a second embodiment will be described with reference to FIGS. 9 to 17. The imaging device 100 according to the present embodiment differs from the first embodiment in that the imaging device 100 has reading circuits 50B each including four transistors.
(Structure of Imaging Device 100)

The imaging Device 100 according to the present embodiment has two-dimensionally arranged unit pixel cells 110B and peripheral circuitry, as in the first embodiment. The unit pixel cells 110B are connected to the peripheral circuitry through various control lines.

Figure 9:
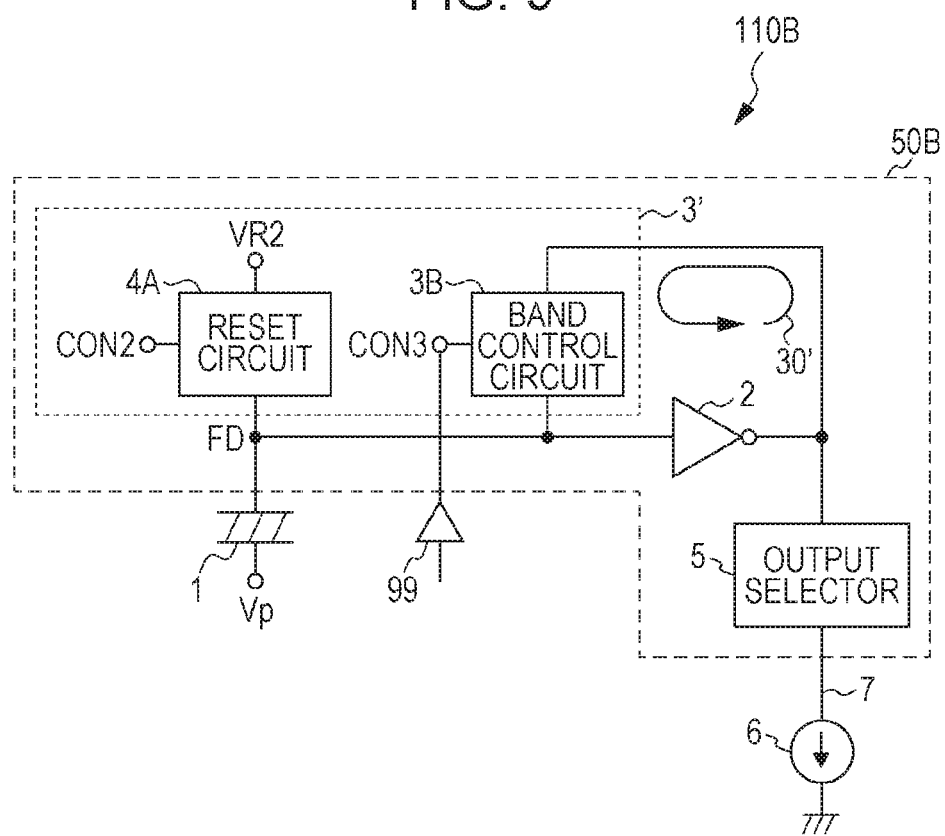
FIG. 9 is a schematic diagram illustrating an exemplary circuit configuration of each unit pixel cell in an imaging device according to a second embodiment.

FIG. 9 schematically illustrates an exemplary circuit configuration of each unit pixel cell 110B in the imaging device 100 according to the present embodiment. The unit pixel cell 110B includes a photodetector 1 and a reading circuit 50B. The reading circuit 50B includes an amplifier 2, a band controller 3', an FD, and an output selector 5. The reading circuit 50B reads signal charge generated by the photodetector 1.

The FD is connected to the photodetector 1 via a wiring layer. The FD is further connected to an input end of the amplifier 2. The amplifier 2 amplifies a signal corresponding to signal charge accumulated in the FD and outputs the amplified signal to the band controller 3' and the output selector 5.

The band controller 3' includes a reset circuit 4A, which resets the FD, and a band control circuit 3B. At least three voltages that are different from each other are supplied from a voltage control circuit 99 to the band control circuit 3B. Since such voltages are supplied to the band control circuit 3B, it has a band control function. The band control circuit 3B applies band limitation to the signal output from the amplifier 2 and outputs the resulting signal to the FD. The signal charge accumulated in the FD is reset by the reset circuit 4A. A signal read from the FD is amplified by the amplifier 2. The amplified signal is subjected to band limitation by the band control circuit 3B, and the resulting signal is fed back to the FD.

The output selector 5 is connected to the signal reading line 7. The signal reading line 7 is shared by at least two unit pixel cells. The signal amplified by the amplifier 2 is output to the signal reading line 7 via the output selector 5.

Figure 10:
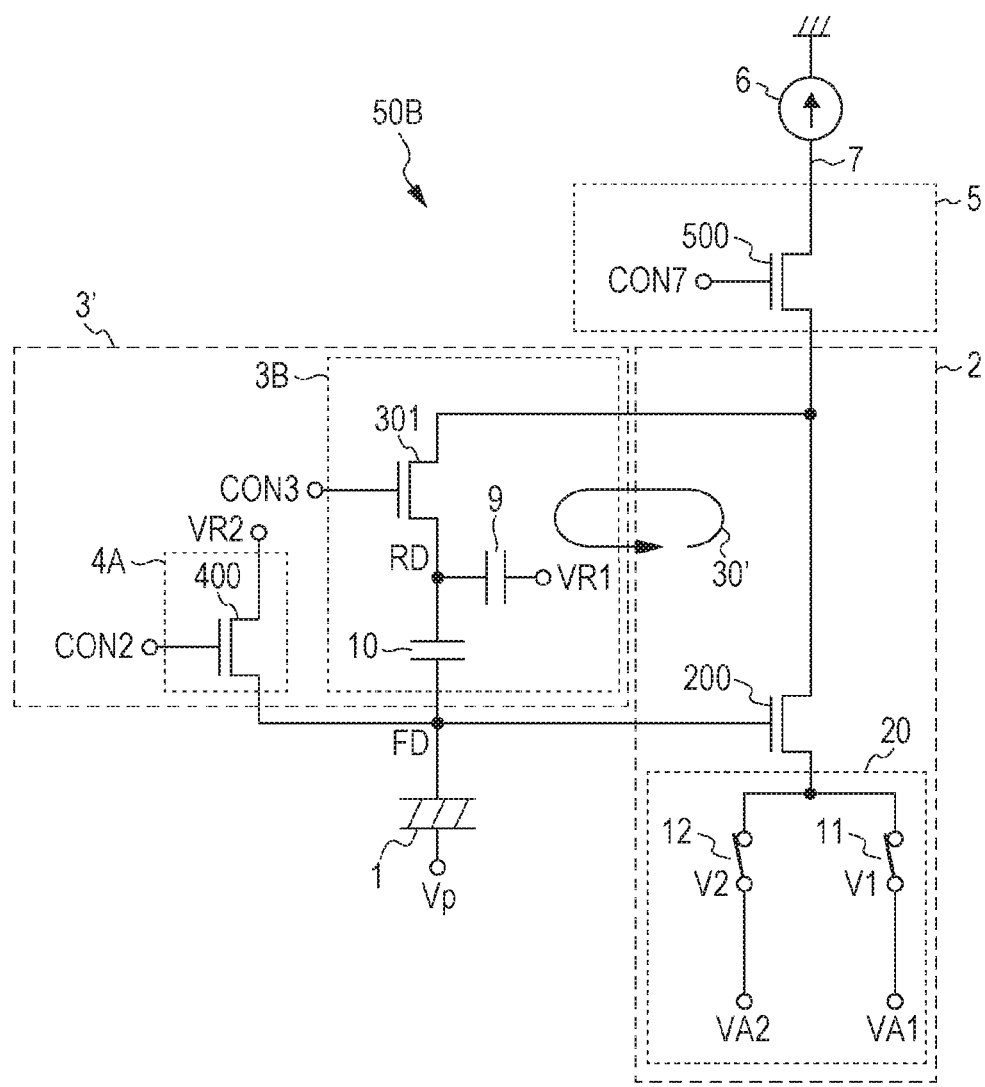
FIG. 10 is a schematic diagram illustrating an exemplary circuit configuration of a reading circuit according to the second embodiment.

FIG. 10 schematically illustrates one example of the circuit configuration of the reading circuit 50B. A feedback circuit 30' negatively feeds back a signal, which is input from the photodetector 1, to the FD via a first amplification transistor 200.

A reset circuit 4A in the band controller 3' includes a reset transistor 400. The band control circuit 3B includes a second band control transistor 301, a first capacitor 9, and a second capacitor 10. The term "capacitor" as used herein refers to a structure in which a dielectric, such as an insulating film, is interposed between electrodes. The "electrodes" are not limited to electrodes made of metal and are widely construed as including a polysilicon layer or the like. The electrodes may be a part of a semiconductor substrate. The first capacitor 9 and the second capacitor 10 may be, for example, metal-insulator-metal (MIM) capacitors or metal-insulator-semiconductor (MIS) capacitors.

An amplifier 2 has the first amplification transistor 200 and a switching circuit 20 including a first switching element 11 and a second switching element 12. An output selector 5 includes a first selection transistor 500. The following description will be given of a relationship of electrical connections in the reading circuit 50B.

The gate of the first amplification transistor 200 is connected to the FD. One of the source and the drain of the first amplification transistor 200 is connected to one of the source and the drain of the second band control transistor 301 and to one of the source and the drain of the first selection transistor 500. The other of the source and the drain of the second band control transistor 301 is connected to one end of the first capacitor 9. A reference voltage VR1 is applied to the other end of the first capacitor 9. Thus, the second band control transistor 301 and the first capacitor 9 form an RC filter circuit.

The other of the source and the drain of the second band control transistor 301 is also connected to one end of the second capacitor 10. The other end of the second capacitor 10 is connected to the FD. A node formed among the second band control transistor 301, the first capacitor 9, and the second capacitor 10 is herein referred to as an "RD".

A band control signal line CON3 is connected to the gate of the second band control transistor 301. The state of the second band control transistor 301 is determined by the voltage of the band control signal line CON3. For example, when the voltage of the band control signal line CON3 is at a high level, the second band control transistor 301 is turned on. At this point in time, the FD, the first amplification transistor 200, the second band control transistor 301, and the second capacitor 10 form a feedback loop (the feedback circuit 30').

When the voltage of the band control signal line CON3 decreases, resistance components of the second band control transistor 301 increase. Thus, the band of the second band control transistor 301 is narrowed, and the frequency band of a signal that is fed back is narrowed.

When the feedback loop is formed, a signal output from the second band control transistor 301 is attenuated by an attenuation circuit formed by the second capacitor 10 and parasitic capacitance of the FD, and the resulting signal is fed back to the FD. When the capacitance of the second capacitor 10 is represented by Cc, and the parasitic capacitance of the FD is represented by Cfd, an attenuation rate B is given by Cc/(Cc+Cfd).

When the voltage of the band control signal line CON3 decreases further to reach the low level, the second band control transistor 301 is turned off, and no feedback loop is formed.

The FD is further connected to one of the source and the drain of the reset transistor 400. A reference voltage VR2 is applied to the other of the source and the drain of the reset transistor 400. The gate of the reset transistor 400 is connected to a reset control signal line CON2, and the state of the reset transistor 400 is determined by the voltage of the reset control signal line CON2. For example, when the voltage of the reset control signal line CON2 is at a high level, the reset transistor 400 is turned on, and the FD is reset to have the reference voltage VR2.

The other of the source and the drain of the first selection transistor 500 is connected to the signal reading line 7. The gate of the first selection transistor 500 is connected to the selection control signal line CON7, and the state of the first selection transistor 500 is determined by the voltage of the selection control signal line CON7. For example, when the voltage of the selection control signal line CON7 is at a high level, the first selection transistor 500 is turned on, and the first amplification transistor 200 and the signal reading line 7 are electrically connected to each other. When the voltage of the selection control signal line CON7 is at a low level, the first selection transistor 500 is turned off. As a result, the first amplification transistor 200 and the signal reading line 7 are electrically isolated from each other.

The switching circuit 20 is connected to the other of the source and the drain of the first amplification transistor 200. More specifically, the other of the source and the drain of the first amplification transistor 200 is connected to a first voltage source VA1 via the first switching element 11. The other of the source and the drain of the first amplification transistor 200 is also connected to a second voltage source VA2 via the second switching element 12. The switching circuit 20 is controlled with control signals V1 and V2 to thereby switch the voltage, which is applied to the other of the source and the drain of the first amplification transistor 200, between a voltage Va1 and a voltage Va2. The voltage Va1 of the first voltage source VA1 is, for example, a ground voltage GND. The voltage Va2 of the second voltage source VA2 is, for example, a power-supply voltage VDD. The switching circuit 20 may be provided for each unit pixel cell or may be shared by a plurality of unit pixel cells in order to reduce the number of elements per unit pixel cell.

The constant current source 6 is connected to the signal reading line 7. When the first selection transistor 500 is on, the first selection transistor 500, the first amplification transistor 200, and the constant current source 6 form a source follower circuit. A signal corresponding to the signal charge accumulated in the FD is output to the signal reading line 7 and is output to outside of the unit pixel cell. The constant current source 6 may be provided for each unit pixel cell or may be shared by a plurality of unit pixel cells in order to reduce the number of elements per unit pixel cell.

Next, an operation flow of the reading circuit 50B will be described with reference to FIG. 11.

Figure 11:
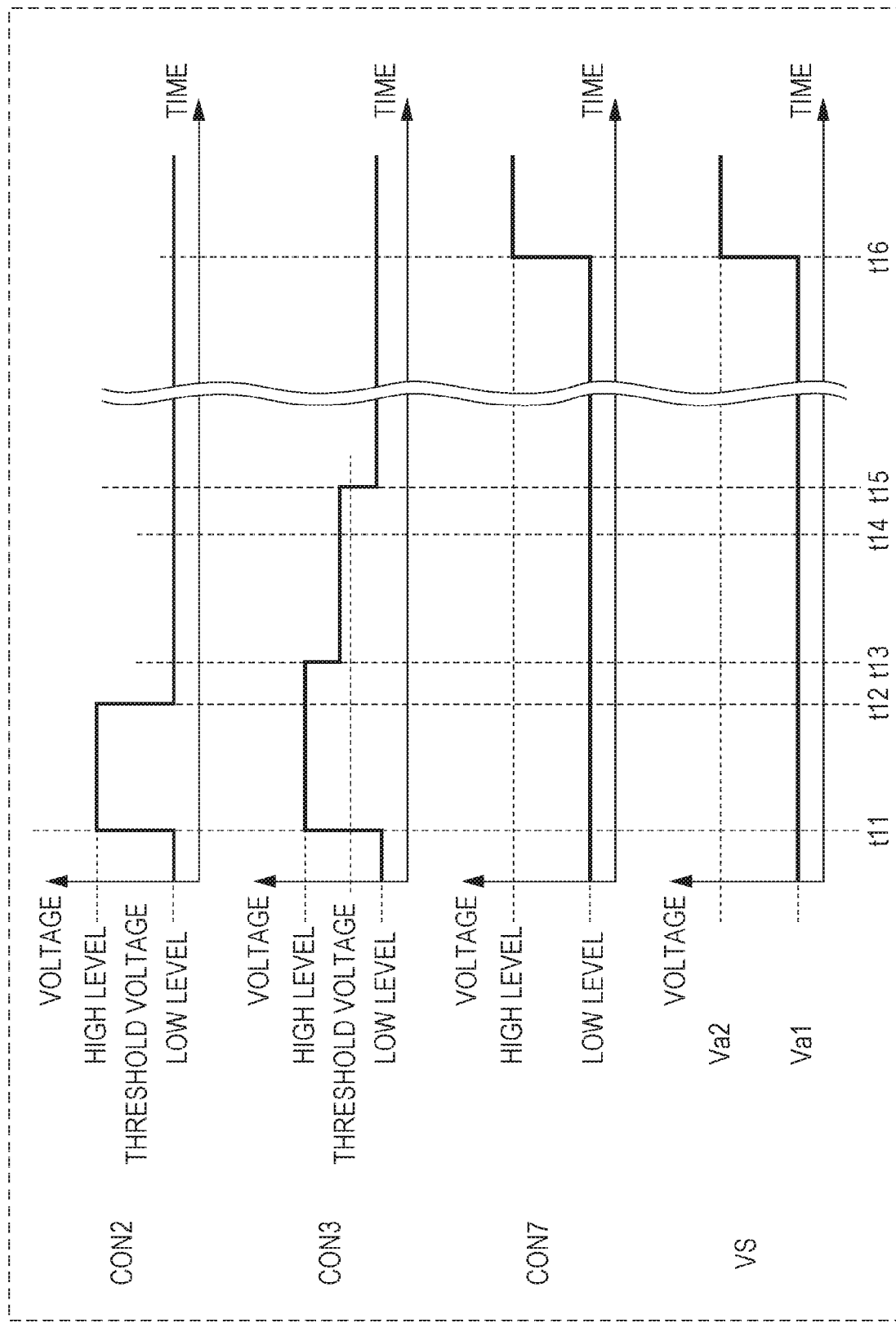
FIG. 11 is a timing chart illustrating one example of the operation of the reading circuit.
Figure 12:
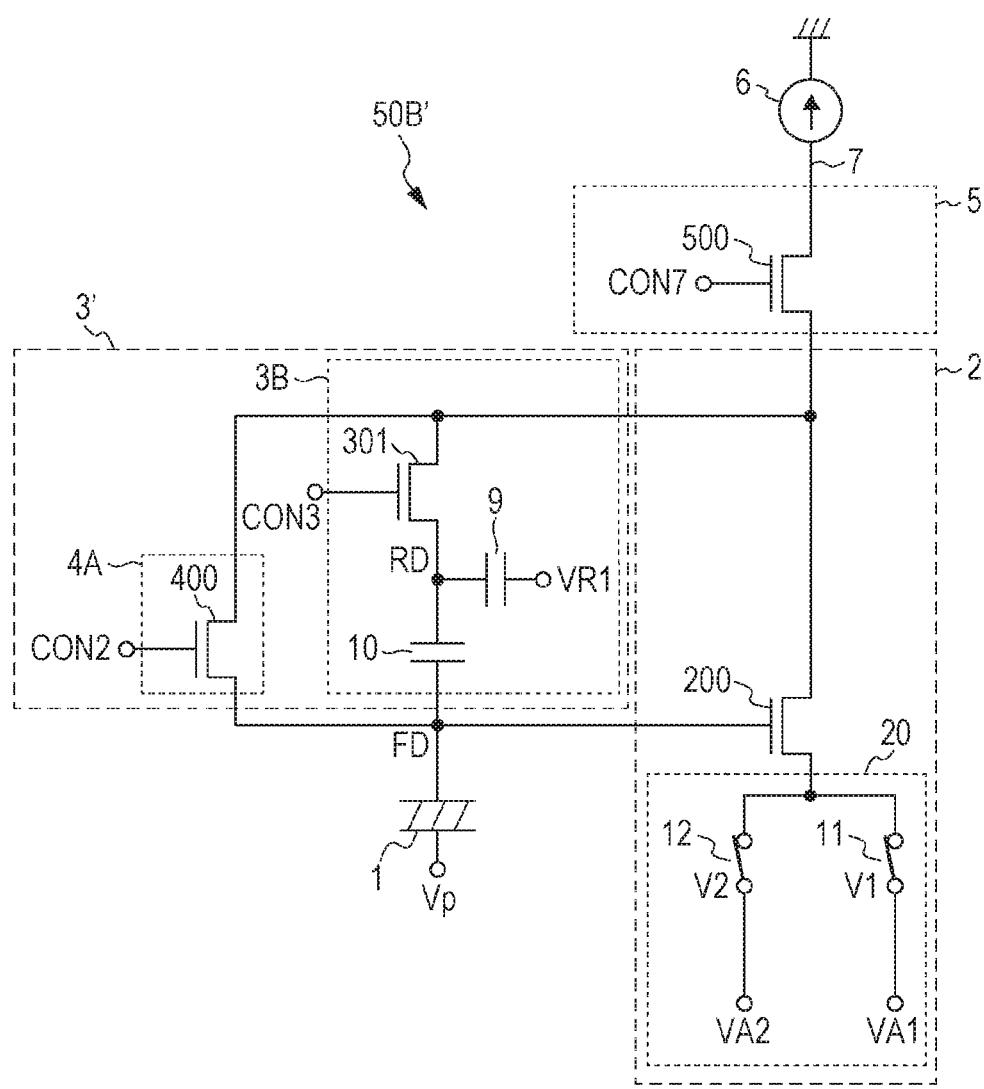
FIG. 12 is a schematic diagram illustrating an exemplary circuit configuration of the reading circuit according to the second embodiment.
Figure 13:
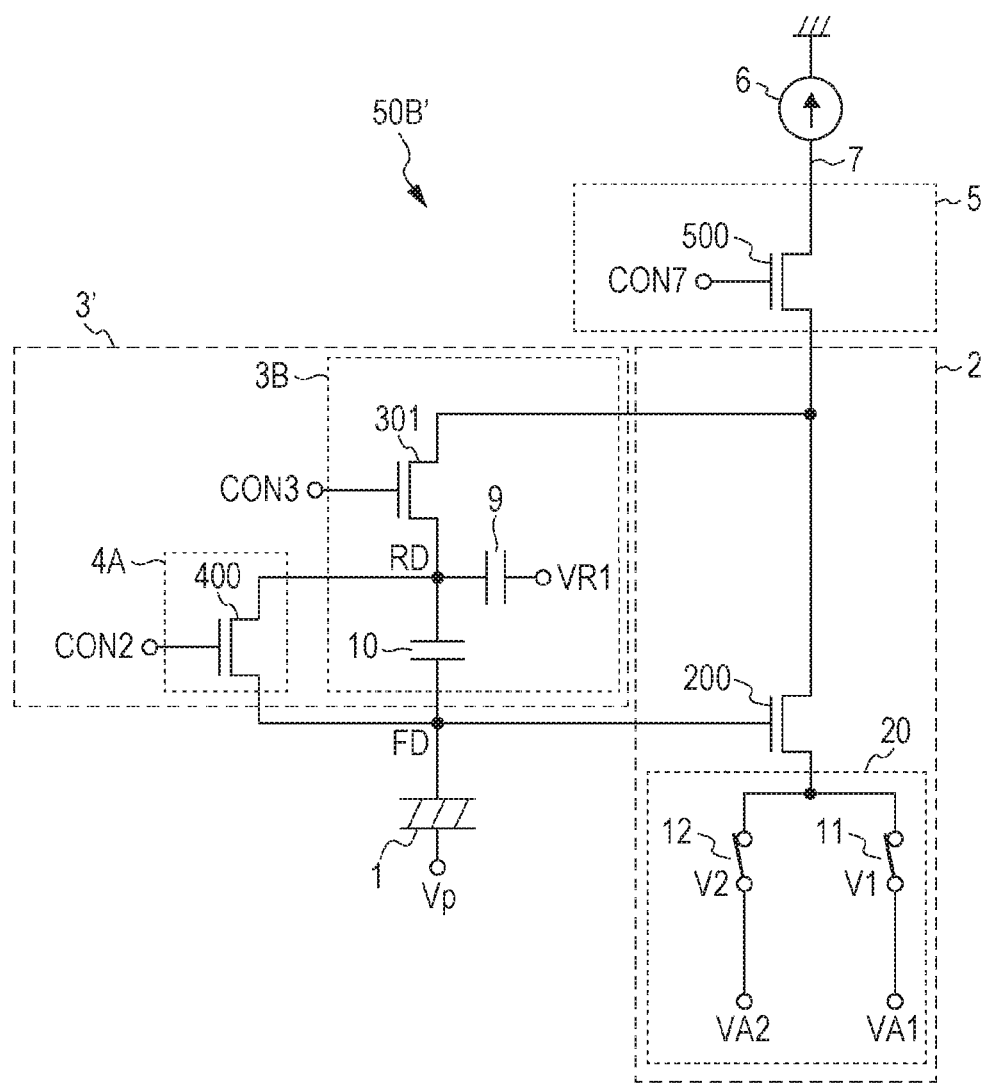
FIG. 13 is a schematic diagram illustrating another exemplary circuit configuration of the reading circuit according to the second embodiment.

FIG. 11 is a timing chart illustrating one example of the operation of the reading circuit 50B. The horizontal axis in each graph represents time, and the vertical axes represent a voltage of the reset control signal line CON2, a voltage of the band control signal line CON3, a voltage of the selection control signal line CON7, and a voltage VS of the other of the source and the drain of the first amplification transistor 200 sequentially from the top in FIG. 11.

(Reset Period)

At time t11, the voltage of the selection control signal line CON7 is at the low level. Thus, the first selection transistor 500 is in an off state, and the first amplification transistor 200 and the signal reading line 7 are electrically isolated from each other. Also, at time t11, the voltage of the band control signal line CON3 is set to the high level to put the second band control transistor 301 into an on state. Also, at time t11, the first switching element 11 in the switching circuit 20 is in an on state, and the voltage Va1 (e.g., GND) is applied to the other of the source and the drain of the first amplification transistor 200. In addition, at time t11, the voltage of the reset control signal line CON2 is set to the high level to turn on the reset transistor 400, so that the FD is reset, and the voltage of the FD reaches the reference voltage VR2.

At time t12, the voltage of the reset control signal line CON2 is set to the low level to turn off the reset transistor 400. At this point in time, the reading circuit 50B forms a feedback circuit in which the amplification factor is −A×B. Thus, kTC noise that is generated in the FD when the reset transistor 400 is turned off is reduced to $1/(1+A \times B)$. It is possible to suppress kTC noise at high speed by setting the voltage of the band control signal line CON3 to a high level so that the operating band of the second band control transistor 301 is a first band, which is a wideband.

(Noise Suppression Period)

In the period of time t13 to time t15, the voltage of the band control signal line CON3 is set to a voltage between the high level and the low level, for example, to an intermediate voltage. In this case, the operating band of the second band control transistor 301 is a second band, which is narrower than the first band.

When the second band is made to be sufficiently narrower than the operating band of the first amplification transistor 200, the noise suppression effect increases, but the period from t13 to time t15 increases. Even when the second band is wider than the operating band of the first amplification transistor 200, the noise suppression effect can be obtained. The designer can arbitrarily design the second band in accordance with an allowable time in the period of time t13 to time t15. The second band is hereinafter regarded as a band that is sufficiently narrower than the operating band of the first amplification transistor 200.

When the second band is narrower than the operating band of the first amplification transistor 200, the feedback circuit 30' reduces thermal noise generated in the second band control transistor 301 to $1/(1+A \times B)^{1/2}$. In this state, when the voltage of the band control signal line CON3 is set to the low level at time t15 to turn off the second band control transistor 301, kTC noise that remains in the FD at this point in time has the value of the square root of the sum of the square of kTC noise due to the reset transistor 400 and the square of kTC noise due to the second band control transistor 301.

When the capacitance of the first capacitor 9 is Cs and there is no suppression due to the feedback, kTC noise of the second band control transistor 301 is $(Cfd/Cs)^{1/2}$ times as large as the kTC noise of the reset transistor 400. In view of this point, when compared with a case in which no feedback is performed, kTC noise in a case where the feedback is performed is reduced to $\{1+(1+A \times B) \times Cfd/Cs\}^{1/2}/(1+A \times B)$.

(Exposure/Reading Period)

The voltage of the selection control signal line CON7 is set to the high level at time t16 to turn on the first selection transistor 500, and the switching circuit 20 is controlled so that the voltage of the other of the source and the drain of the first amplification transistor 200 reaches the voltage Va2 (e.g., VDD). In this state, the first amplification transistor 200 and the constant current source 6 form a source follower circuit. The signal reading line 7 has a voltage corresponding to the signal charge accumulated in the FD. At this point in time, the amplification factor of the source follower circuit is about 1.

At time t16, the voltage of the FD has changed from the reset voltage (VR2) by an amount corresponding to signal charge generated by the photodetector 1 in the period of time t15 to t16. The amplifier 2 amplifies the voltage of the FD by an amplification factor of about 1 and outputs the resulting voltage to the signal reading line 7.

Random noise means fluctuations, that is, kTC noise, in the output signal when the signal charge generated by the photodetector 1 is 0. The kTC noise is reduced to $\{1+(1+A\times B)/Cfd/Cs\}^{1/2}/(1+A\times B)$ in the noise suppression period, and further, the resulting signal is output to the signal reading line 7 in the exposure/reading period with an amplification factor of about 1. As a result, it is possible to obtain favorable image data in which the random noise is reduced.

It is desirable that the capacitance Cs of the first capacitor 9 be larger than the capacitance Cc of the second capacitor 10. In the present embodiment, the random noise can be suppressed by increasing Cs as long as the area permits. Typically, when the capacitance of the first capacitor 9 is increased, the random noise is reduced. However, since the signal level decreases when the FD converts the signal charge into a signal voltage, the SNR is not improved. In the present embodiment, however, since the FD and the RD are separated by the second capacitor 10, the signal level is less likely to decrease even when the capacitance of the first capacitor 9 is increased. As a result, only the random noise is reduced, thus offering an advantage in that only the SNR is improved.

According to the present embodiment, CDS can also be performed in order to cancel variations in the peripheral circuitry, as in the first embodiment. Specifically, after the source follower circuit reads the signal voltage of the FD, the above-described reset operation is performed again. After the reset operation is completed, the source follower circuit performs the reading operation again before the photodetector 1 detects light. Thus, the reset voltage VRST can be read. It is possible to perform CDS by obtaining the difference between the signal voltage of the FD and the reset voltage.

In the present embodiment, since the source follower circuit reads the signal in the FD in the exposure period, the amplification factor is about 1. The present disclosure, however, is not limited to this amplification factor, and the designer may vary the amplification factor in accordance with an SNR or a circuit range needed for the system.

In the present embodiment, feedback for noise cancelling is performed in each unit pixel cell of the unit pixel cells 110B. This allows the noise cancelling to be performed at high speed without being affected by the time constant of the signal reading line 7. In addition, when the capacitance of the capacitors arranged in each unit pixel cell is increased, a greater noise suppression effect is obtained.

The following description will be given of modifications of the configuration and the operation of the reading circuit 50B according to the present embodiment.

FIGS. 12 to 16 schematically illustrate other examples of the circuit configuration of the reading circuit 50B. Reading circuits 50B' illustrated in FIGS. 12 and 13 differ from the reading circuit 50B illustrated in FIG. 10 in that a voltage (an output voltage of the amplifier 2) of one of the source and the drain of the first amplification transistor 200, instead of the reference voltage VR2, is applied to the reset transistor 400. With such configurations, changes in the voltage of the FD before and after the reset transistor 400 is turned off can be reduced, and the noise suppression can be performed at higher speed.

Figure 14:
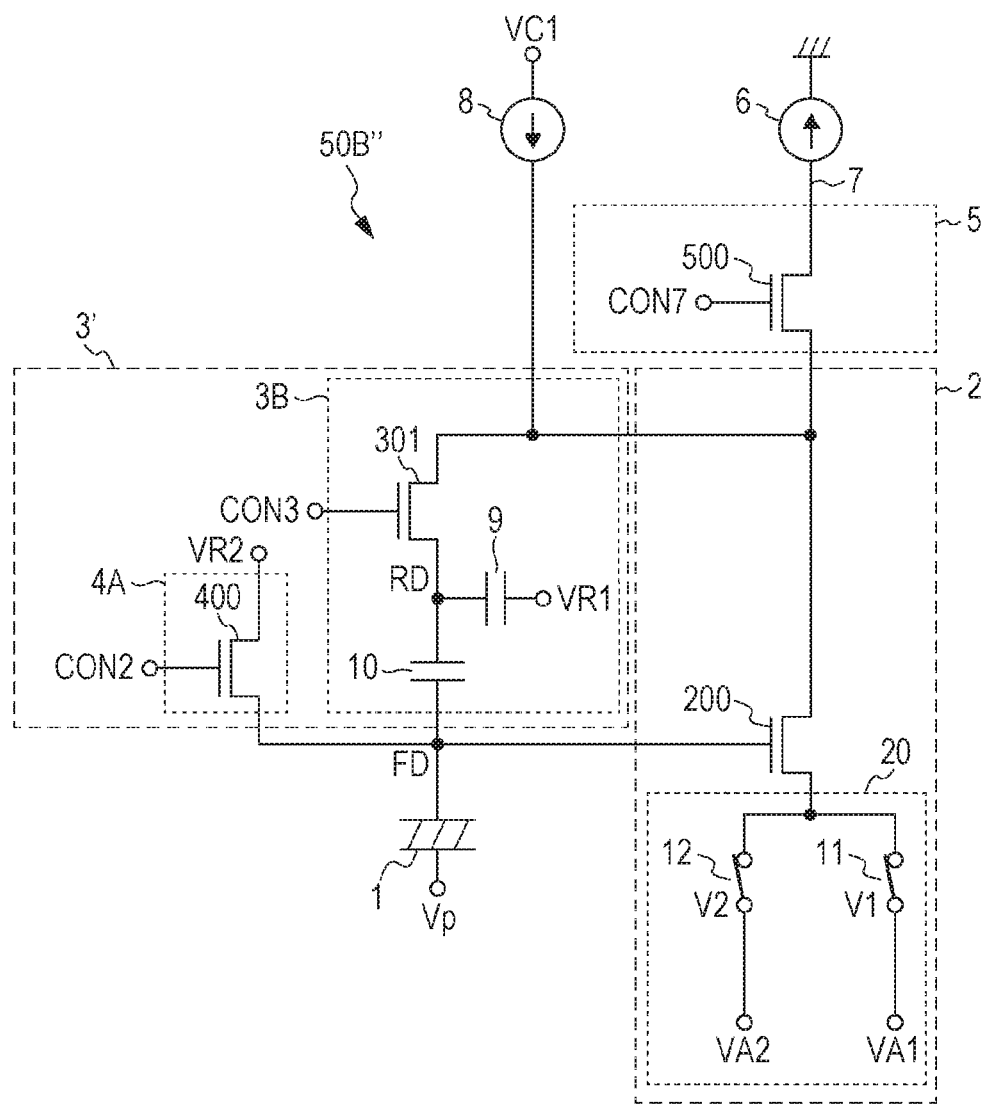
FIG. 14 is a schematic diagram illustrating another exemplary circuit configuration of the reading circuit according to the second embodiment.
Figure 15:
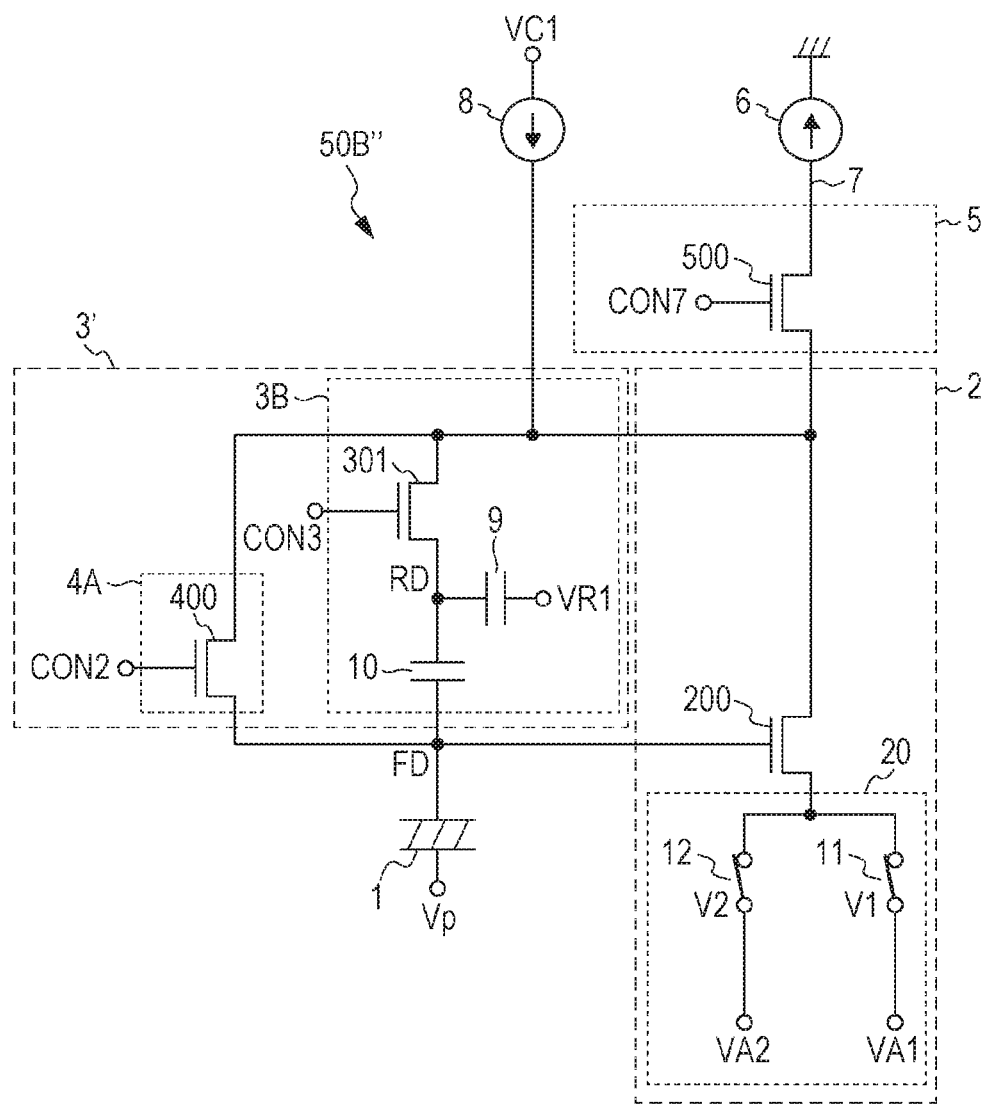
FIG. 15 is a schematic diagram illustrating another exemplary circuit configuration of the reading circuit according to the second embodiment.
Figure 16:
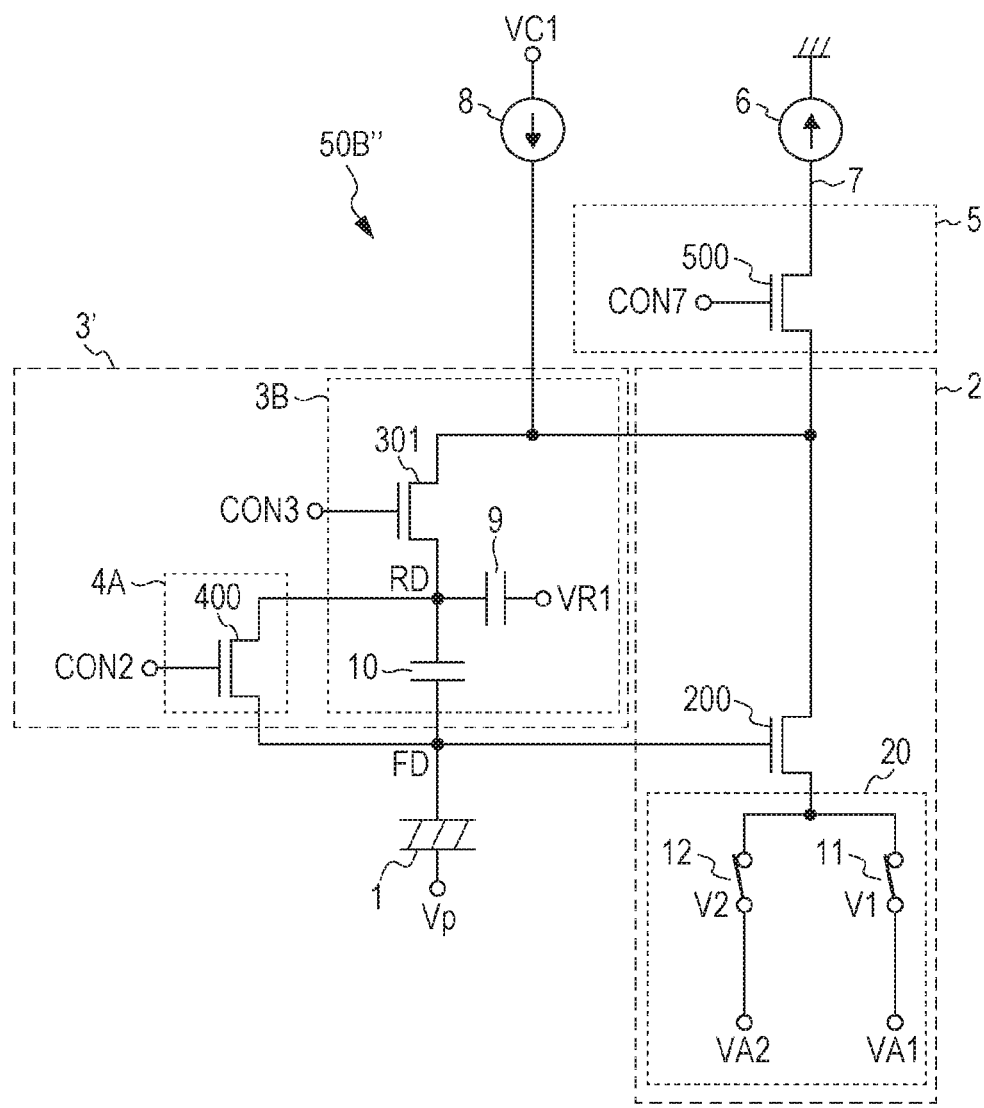
FIG. 16 is a schematic diagram illustrating another exemplary circuit configuration of the reading circuit according to the second embodiment.

In addition, a constant current source 8 may be provided in the unit pixel cell 110B, as illustrated in FIGS. 14 to 16. Such a configuration makes it possible to widen the operating band of the first amplification transistor 200, thus making it possible to widen the band of the second band control transistor 301. Accordingly, in a state in which the band of the second band control transistor 301 is wider, the random noise can be suppressed at higher speed.

Lastly, another control method for the band control signal line CON3 will be described with reference to FIG. 17.

Figure 17:
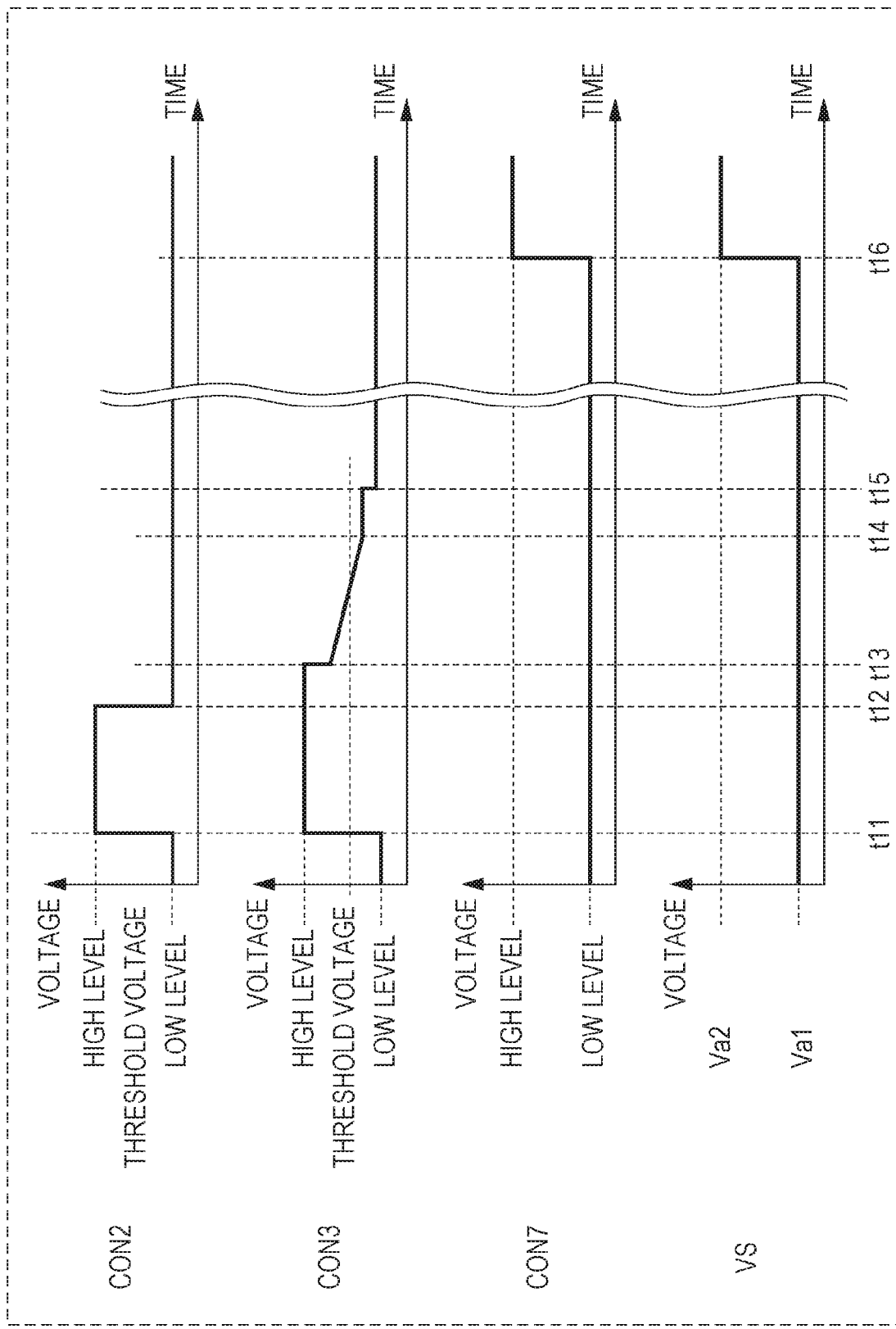
FIG. 17 is a timing chart illustrating another example of the operation of the reading circuit.

FIG. 17 is a timing chart illustrating another example of the operation of the reading circuit 50B. As illustrated in FIG. 17, the taper reset may be applied, as in the first embodiment. That is, the band control signal line CON3 may be controlled so that the second band control transistor 301 changes gradually from the on state to the off state across the threshold voltage therefor.

With such control, even when there are variations in the threshold voltages of the second band control transistors 301 in the unit pixel cells 110B included in the imaging device 100, it is possible to effectively suppress noise that is generated in all the unit pixel cells. Also, a variation range of the voltage applied to the band control signal line CON3 during the taper reset may be limited to a variation range of the threshold voltages of the second band control transistors 301 in the unit pixel cells. This makes it possible to reduce the time taken for the taper reset and makes it possible to perform the noise suppression at high speed.

Third Embodiment

The structure, functions, and a drive method of an imaging device 100 according to a third embodiment will be described with reference to FIGS. 18 to 22B. The imaging device 100 according to the present embodiment differs from the imaging device 100 according to the second embodiment in that an output selector 5C in a reading circuit 50C includes a PMOS transistor serving as a selection transistor and is connected to a switching circuit 40. The following description will be mainly given of differences from the second embodiment.

Figure 18:
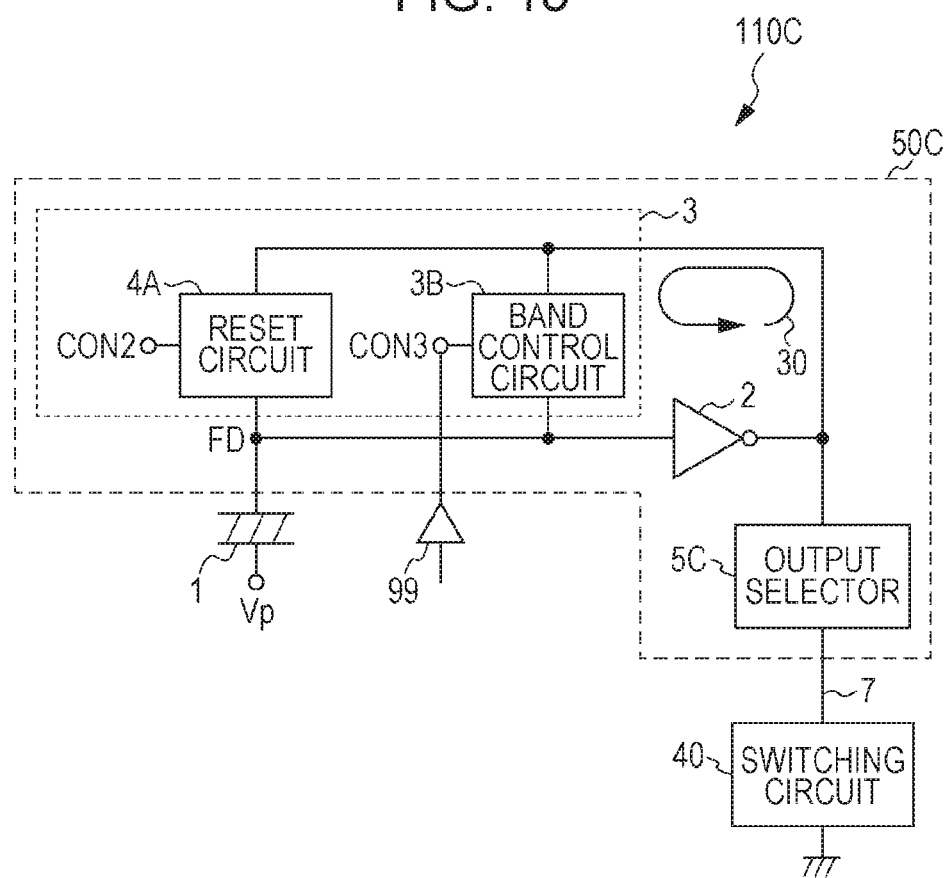
FIG. 18 is a schematic diagram illustrating an exemplary circuit configuration of a unit pixel cell in an imaging device according to a third embodiment.

FIG. 18 schematically illustrates an exemplary circuit configuration of each unit pixel cell 110C in the imaging device 100 according to the present embodiment. Each unit pixel cell 110C includes a photodetector 1 and the reading circuit 50C. The reading circuit 50C includes an amplifier 2, a band controller 3, an FD, and the output selector 5C. The output selector 5C is connected to the switching circuit 40 through the signal reading line 7.

The output selector 5C is connected to the signal reading line 7, which is shared by at least two unit pixel cells. The output selector 5C has a function for outputting a signal amplified by the amplifier 2 to the signal reading line 7 and a function for supplying current to the amplifier 2. It is possible to switch between these functions.

Figure 19A:
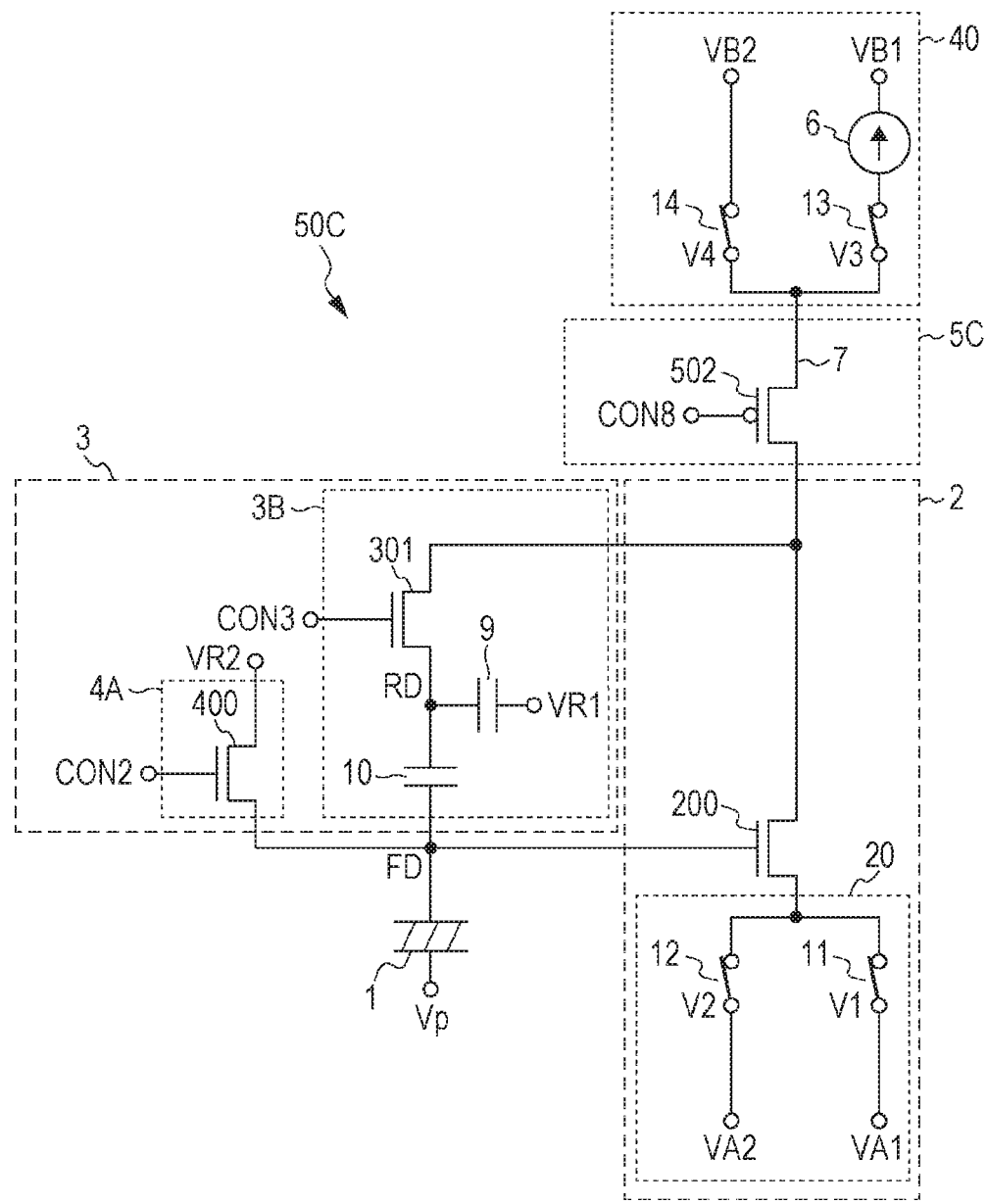
FIG. 19A is a schematic diagram illustrating an exemplary circuit configuration of a reading circuit according to the third embodiment.

FIG. 19A schematically illustrates the circuit configuration of the reading circuit 50C. A feedback circuit 30 negatively feeds back a signal, which is input from the photodetector 1, to the FD via a first amplification transistor 200. One of the source and the drain of a third selection transistor 502 is connected to one of the source and the drain of the first amplification transistor 200. The other of the source and the drain of the third selection transistor 502 is connected to the signal reading line 7. In the present embodiment, the third selection transistor 502 has a polarity that is opposite to the polarity of the first amplification transistor 200. The first amplification transistor 200 is an NMOS transistor, and the third selection transistor 502 is a PMOS transistor.

The gate of the third selection transistor 502 is connected to a selection control signal line CON8. The state of the third selection transistor 502 is determined by the voltage of the selection control signal line CON8. For example, when the voltage of the selection control signal line CON8 is at a low level, the third selection transistor 502 is turned on, and the first amplification transistor 200 and the signal reading line 7 are electrically connected to each other. When the voltage of the selection control signal line CON8 is at a high level, the third selection transistor 502 is turned off, and the first amplification transistor 200 and the signal reading line 7 are electrically isolated from each other.

When the voltage of the selection control signal line CON8 is a voltage between the low level and the high level, for example, an intermediate voltage, the third selection transistor 502 operates as a current source and supplies current to the first amplification transistor 200. The amount of the current is determined by the voltage of the selection control signal line CON8. A designer can design the reading circuit 50C so that the amount of current reaches a desired amount.

The switching circuit 40 is connected to the signal reading line 7. The switching circuit 40 includes a third switching element 13, a fourth switching element 14, voltage sources VB1 and VB2, and a constant current source 6. One end of the constant current source 6 is connected to the signal reading line 7 via the third switching element 13. The voltage source VB2 is connected to the signal reading line 7 via the fourth switching element 14. The voltage source VB1 is connected to the other end of the constant current source 6.

With control signals V3 and V4, it is possible to switch between the voltage source VB2 and the constant current source 6 (the voltage source VB1) to be connected to the signal reading line 7. For example, a voltage Vb1 of the voltage source VB1 is a ground voltage GND, and a voltage Vb2 of the voltage source VB2 is a power-supply voltage VDD.

When the voltage source VB2 is connected to the signal reading line 7, and the voltage of the selection control signal line CON8 is a voltage between the low level and the high level, for example, is an intermediate voltage, the third selection transistor 502 operates as a current source. In this case, the third selection transistor 502 and the first amplification transistor 200 form an inverting amplifier circuit.

When the constant current source 6 is connected to the signal reading line 7, and the voltage of the selection control signal line CON8 is at a low level, the first amplification transistor 200 and the constant current source 6 form a source follower circuit. In this case, the signal in the FD is output to the signal reading line 7.

Although, in the present embodiment, the transistors included in the reading circuit 50C, except for the third selection transistor 502, are NMOS transistors, the polarities of the transistors may be inverted. That is, the third selection transistor 502 may be an NMOS transistor, and the other transistors may be PMOS transistors. All of the transistors in the reading circuit 50C may be NMOS transistors or may be PMOS transistors.

Figure 19B:
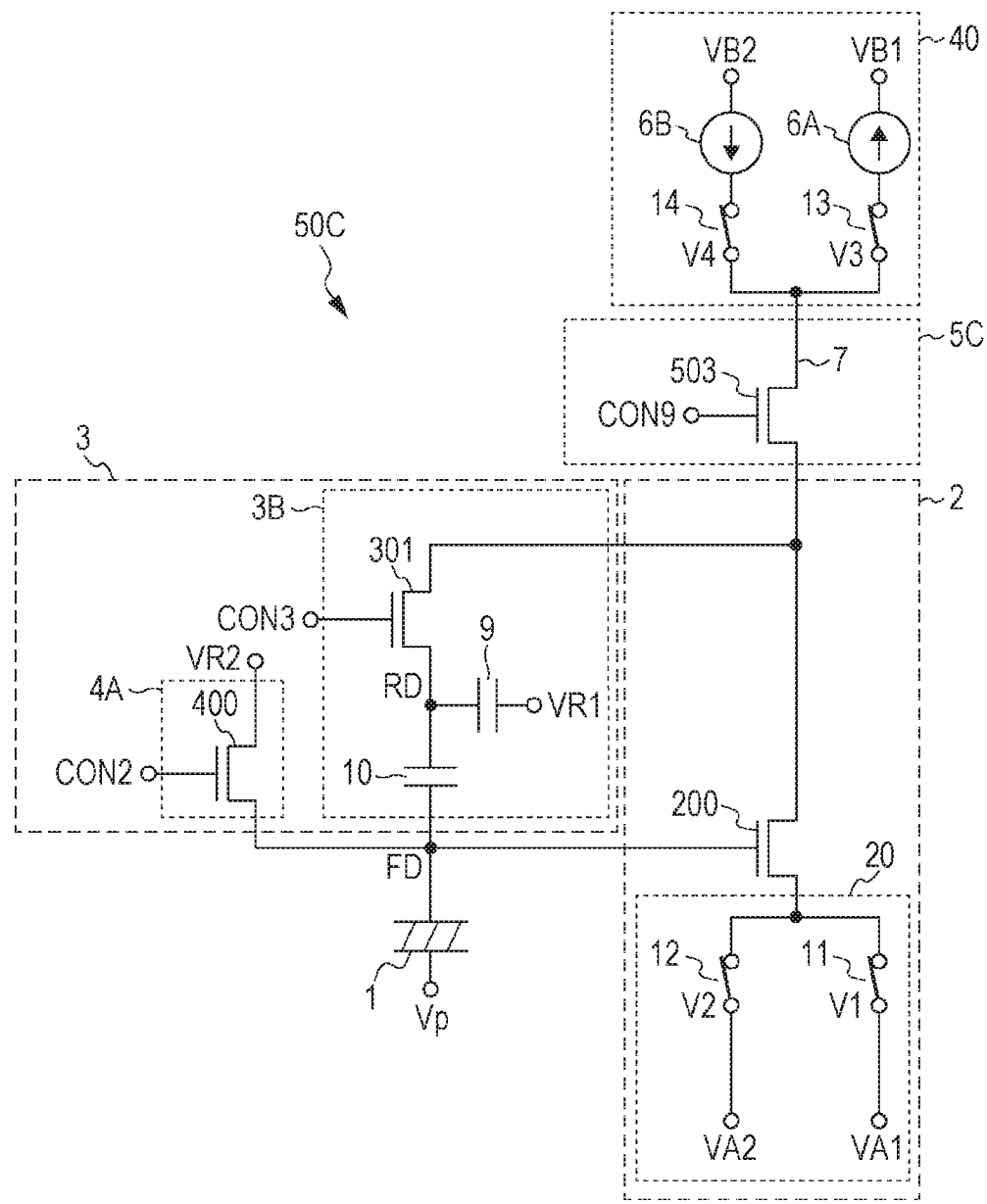
FIG. 19B is a schematic diagram illustrating another exemplary circuit configuration of the reading circuit according to the third embodiment.

A reference to FIG. 19B is made. FIG. 19B illustrates a modification of the configuration described above and illustrated in FIG. 19A. In this modification, the switching circuit 40 has constant current sources 6A and 6B. The output selector 5C also has a fourth selection transistor 503. The polarity of the fourth selection transistor 503 is the same as the polarity of the first amplification transistor 200 and so on. That is the fourth selection transistor 503 is an NMOS transistor.

The gate of the fourth selection transistor 503 is connected to a selection control signal line CON9. The state of the fourth selection transistor 503 is determined by the voltage of the selection control signal line CON9. For example, when the voltage of the selection control signal line CON9 is at a high level, the fourth selection transistor 503 is turned on, and the first amplification transistor 200 and the signal reading line 7 are electrically connected to each other. When the voltage of the selection control signal line CON9 is at a low level, the fourth selection transistor 503 is turned off, and the first amplification transistor 200 and the signal reading line 7 are electrically isolated from each other.

In the configuration illustrated in FIG. 19A, the voltage of the selection control signal line CON8 is set to a voltage between the low level and the high level, for example, to an intermediate voltage, to thereby cause the third selection transistor 502 to operate as a current source. In contrast, in this modification, when the fourth switching element 14 and the fourth selection transistor 503 are turned on, current is supplied from the constant current source 6B to the first amplification transistor 200.

Next, an operation flow of the reading circuit 50C in FIG. 19A will be described with reference to FIG. 20.

FIG. 20 is a timing chart illustrating one example of the operation of the reading circuit 50C. The horizontal axis in each graph represents time, and the vertical axes represent, sequentially from the top, a voltage of the reset control signal line CON2, a voltage of the band control signal line CON3, a voltage of the selection control signal line CON8, and a voltage VS of the other of the source and the drain of the first amplification transistor 200 which is connected to the switching circuit 20.

(Reset Period)

At time t21, the voltage of the selection control signal line CON8 is set to a voltage between the low level and the high level, for example, to an intermediate voltage. Also, the switching circuit 40 is controlled so that the voltage source VB2 is connected to the signal reading line 7. Also, the voltage of the band control signal line CON3 is set to the high level to turn on the second band control transistor 301. At time t21, the other of the source and the drain of the first amplification transistor 200 is connected to the first voltage source VA1. The voltage Va1 of the first voltage source VA1 is, for example, a ground voltage GND. In addition, at time t21, the voltage of the reset control signal line CON2 is set to the high level to turn on the reset transistor 400, so that the FD is reset. As a result, the voltage of the FD becomes equal to the reference voltage VR2.

At time t22, the voltage of the reset control signal line CON2 is set to the low level to turn off the reset transistor 400. At this point in time, the reading circuit 50C forms a feedback loop with an amplification factor of −A×B. Thus, the kTC noise in the FD when the reset transistor 400 is turned off is reduced to 1/(1+A×B). The voltage of the band control signal line CON3 is set so that the operating band of the second band control transistor 301 is a first band, which is a wideband. This makes it possible to suppress noise at high speed.

(Noise Suppression Period)

In the period of time t23 to time t25, the voltage of the band control signal line CON3 is set to a voltage between the high level and the low level, for example, to an intermediate voltage. In this case, the operating band of the second band control transistor 301 is a second band, which is narrower than the first band.

When the second band is made to be sufficiently narrower than the operating band of the first amplification transistor 200, the noise suppression effect increases, but the period from time t23 to time t25 increases. Even when the second band is higher than the operating band of the first amplification transistor 200, the noise suppression effect is obtained. Hence, the designer can arbitrarily design the second band in accordance with an allowable time in the period of time t23 to time t25. The second band is hereinafter regarded as a band that is sufficiently narrower than the operating band of the first amplification transistor 200.

When the second band is narrower than the operating band of the first amplification transistor 200, the feedback circuit 30 reduces thermal noise generated in the second band control transistor 301 to $1/(1+A\times B)^{1/2}$. In this state, when the voltage of the band control signal line CON3 is set to the low level at time t25 to turn off the second band control transistor 301, kTC noise that remains in the FD at this point in time has the value of the square root of the sum of the square of kTC noise due to the reset transistor 400 and the square of kTC noise due to the second band control transistor 301.

When the capacitance of the first capacitor 9 is Cs and there is no suppression due to the feedback, kTC noise of the second band control transistor 301 is $(Cfd/Cs)^{1/2}$ times as large as the kTC noise of the reset transistor 400. In view of this point, when compared with a case in which no feedback is performed, kTC noise in a case where the feedback is performed is reduced to $\{1+(1+A\times B)\times Cfd/Cs\}^{1/2}/(1+A\times B)$. At time t25, the voltage of the selection control signal line CON8 is set to the high level to turn off the third selection transistor 502. As a result, the first amplification transistor 200 and the signal reading line 7 are electrically isolated from each other.

As in the operation flow described in the second embodiment and illustrated in FIG. 17, the taper reset may also be applied. That is, in the period of time t23 to time t24, the band control signal line CON3 may also be controlled so that the second band control transistor 301 changes gradually from the on state to the off state across the threshold voltage therefor.

With such control, even when there are variations in the threshold voltages for the second band control transistors 301 in the unit pixel cells 110C included in the imaging device 100, it is possible to effectively suppress noise that is generated in all the unit pixel cells. Also, a variation range of the voltage applied to the band control signal line CON3 during the taper reset may be limited to a variation range of the threshold voltages of the second band control transistors 301 in the unit pixel cells. This makes it possible to reduce the time taken for the taper reset and makes it possible to perform the noise suppression at high speed.

(Exposure/Reading Period)

At time t26, the voltage of the selection control signal line CON8 is set to the low level to turn on the third selection transistor 502, and the switching circuit 20 is controlled so that the voltage of the other of the source and the drain of the first amplification transistor 200 reaches the voltage Va2 (e.g., VDD). The switching circuit 40 is also controlled so that the constant current source 6 is connected to the signal reading line 7. In this state, the first amplification transistor 200 and the constant current source 6 form a source follower circuit. The signal reading line 7 has a voltage corresponding to the signal charge accumulated in the FD. At this point in time, the amplification factor of the source follower circuit is about 1.

At time t26, the voltage of the FD has changed relative to the reset voltage (VR2) by an amount corresponding to a voltage according to the signal charge generated by the photodetector 1 in the period of time t25 to time t26. The amplifier 2 amplifies the voltage of the FD by an amplification factor of about 1 and outputs the resulting voltage to the signal reading line 7.

The kTC noise is reduced to $\{1+(1+A\times B)/Cfd/Cs\}^{1/2}/(1+A\times B)$ in the noise suppression period, and further, the resulting signal is output to the signal reading line 7 in the exposure/reading period with an amplification factor of about 1. Thus, it is possible to obtain good image data in which the random noise is reduced.

In the present embodiment, the random noise can be suppressed by increasing Cs as long as the area permits, as in the second embodiment. Typically, when the capacitance of the first capacitor 9 is increased, the random noise decreases. However, since the signal level decreases when the FD converts the signal charge into a signal voltage, the SNR is not improved. In the present embodiment, however, since the FD and the RD are separated by the second capacitor 10, the signal level is less likely to decrease even when the capacitance of the first capacitor 9 is increased. As a result, only the random noise is reduced, thus offering an advantage in that only the SNR is improved.

According to the present embodiment, CDS can also be performed in order to cancel variations in the peripheral circuitry, as in the second embodiment. Specifically, after the source follower circuit reads the signal voltage of the FD, the above-described reset operation is performed again. After the reset operation is completed, the source follower circuit performs the reading operation again before the photodetector 1 detects light. Thus, the reset voltage VRST can be read. It is possible to perform CDS by obtaining the difference between the signal voltage of the FD and the reset voltage.

Also, feedback for noise cancelling is performed in each of the unit pixel cells of the unit pixel cells 110C. This allows the noise cancelling to be performed at high speed without being affected by the time constant of the signal reading line 7. In addition, when the capacitance of the capacitors arranged in each unit pixel cell 110C is increased, a greater noise suppression effect is obtained.

Also, in the present embodiment, since the source follower circuit reads the signal in the FD in the exposure period, the amplification factor is about 1. The present disclosure, however, is not limited to this amplification factor, and the designer may vary the amplification factor in accordance with an SNR or a circuit range needed for the system.

The following description will be given of modifications of the configuration and the operation of the reading circuit 50C according to the present embodiment.

Figure 21A:
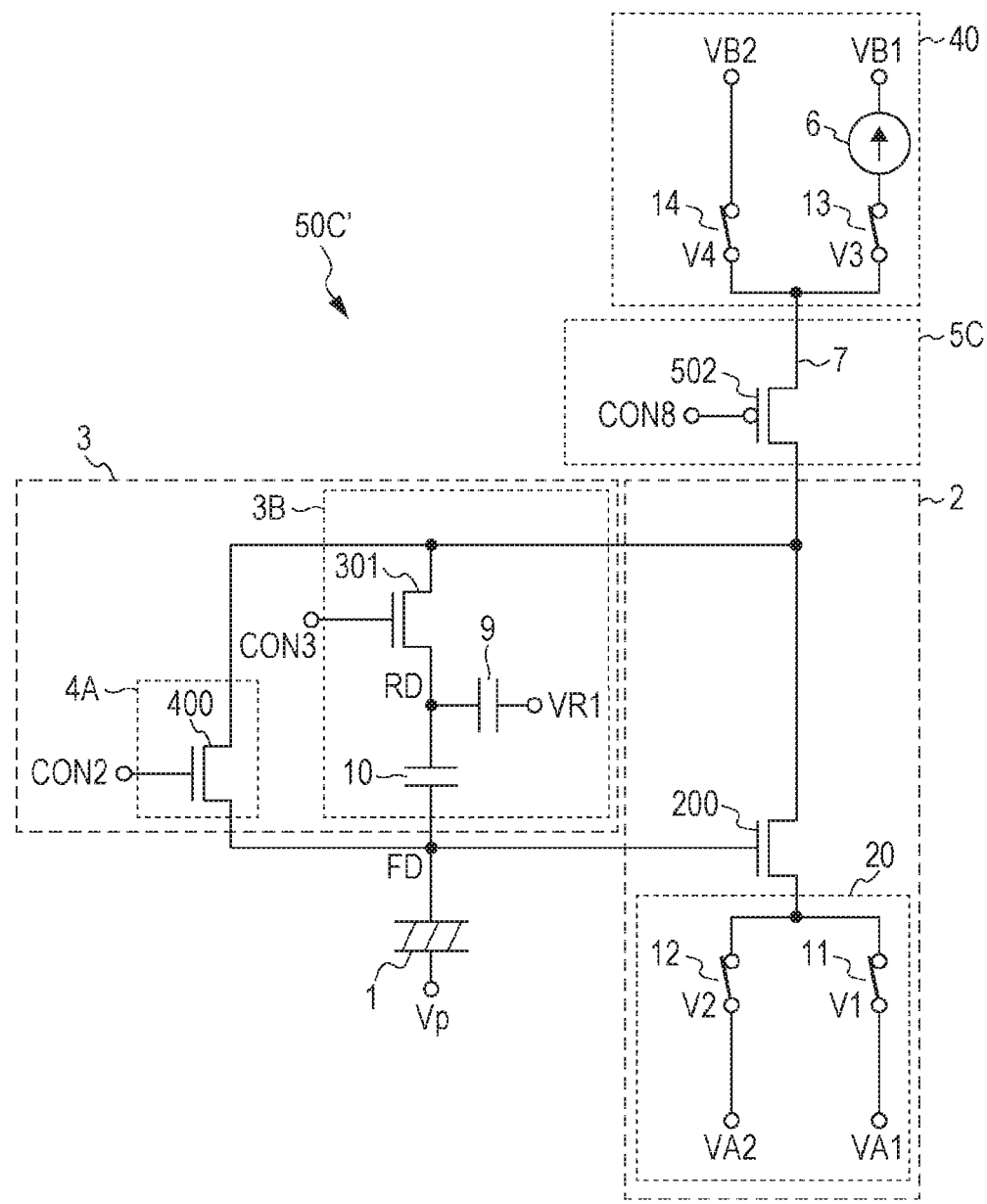
FIG. 21A is a schematic diagram illustrating another exemplary circuit configuration of the reading circuit according to the third embodiment.
Figure 22A:
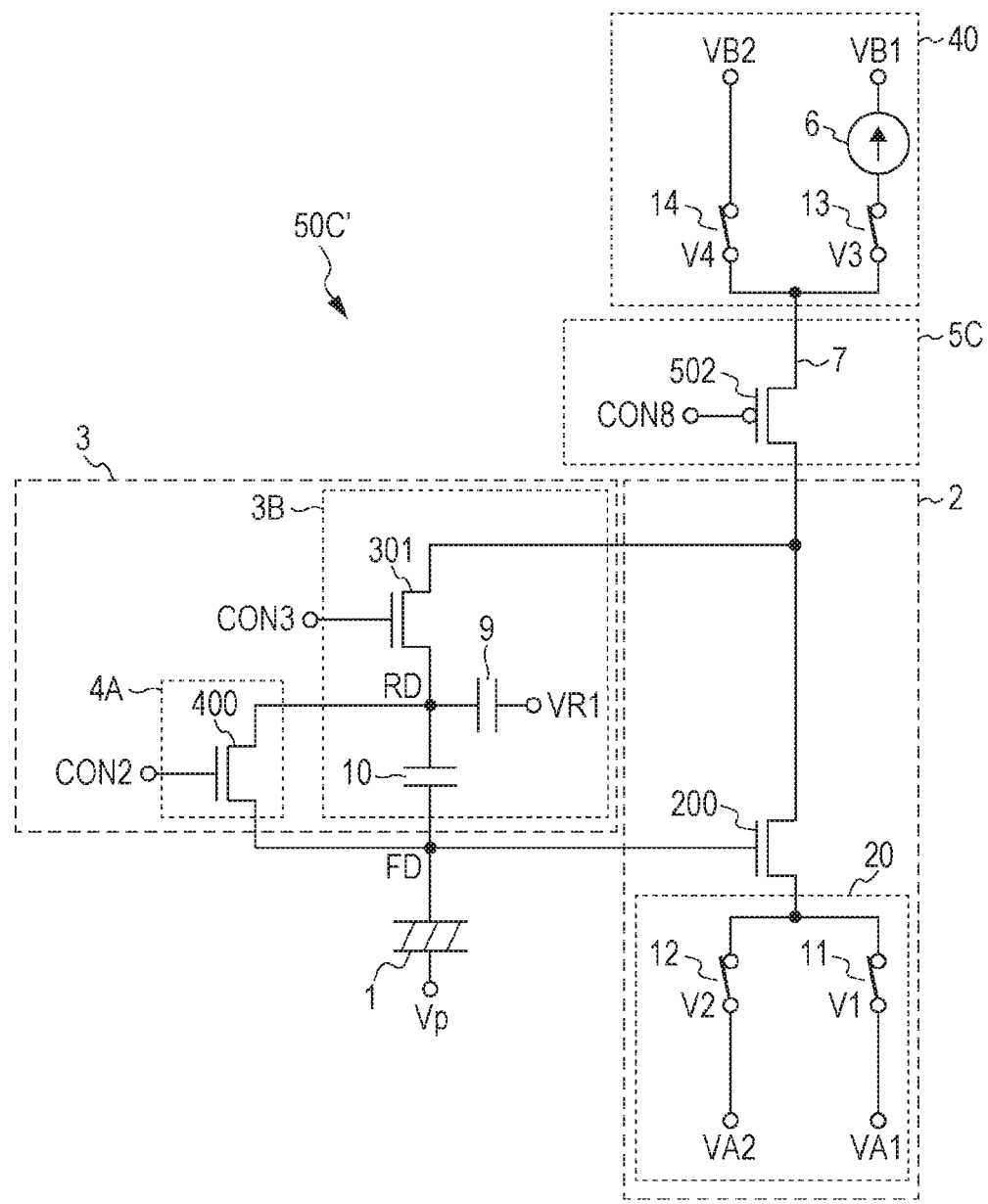
FIG. 22A is a schematic diagram illustrating another exemplary circuit configuration of the reading circuit according to the third embodiment.

FIGS. 21A and 22A schematically illustrate other circuit configurations of the reading circuit 50C. In reading circuits 50C' illustrated in FIGS. 21A and 22A, a voltage (an output voltage of the amplifier 2) of one of the source and the drain of the first amplification transistor 200, instead of the reference voltage VR2, is applied to the reset transistor 400. In this point, the reading circuits 50C' illustrated in FIGS. 21A and 22A differ from the reading circuit 50C illustrated in FIG. 19A. According to the configurations illustrated in FIGS. 21A and 22A, since changes in the voltages of the FD before and after the reset transistor 400 is turned off can be reduced, the noise suppression can be performed at higher speed.

Figure 21B:
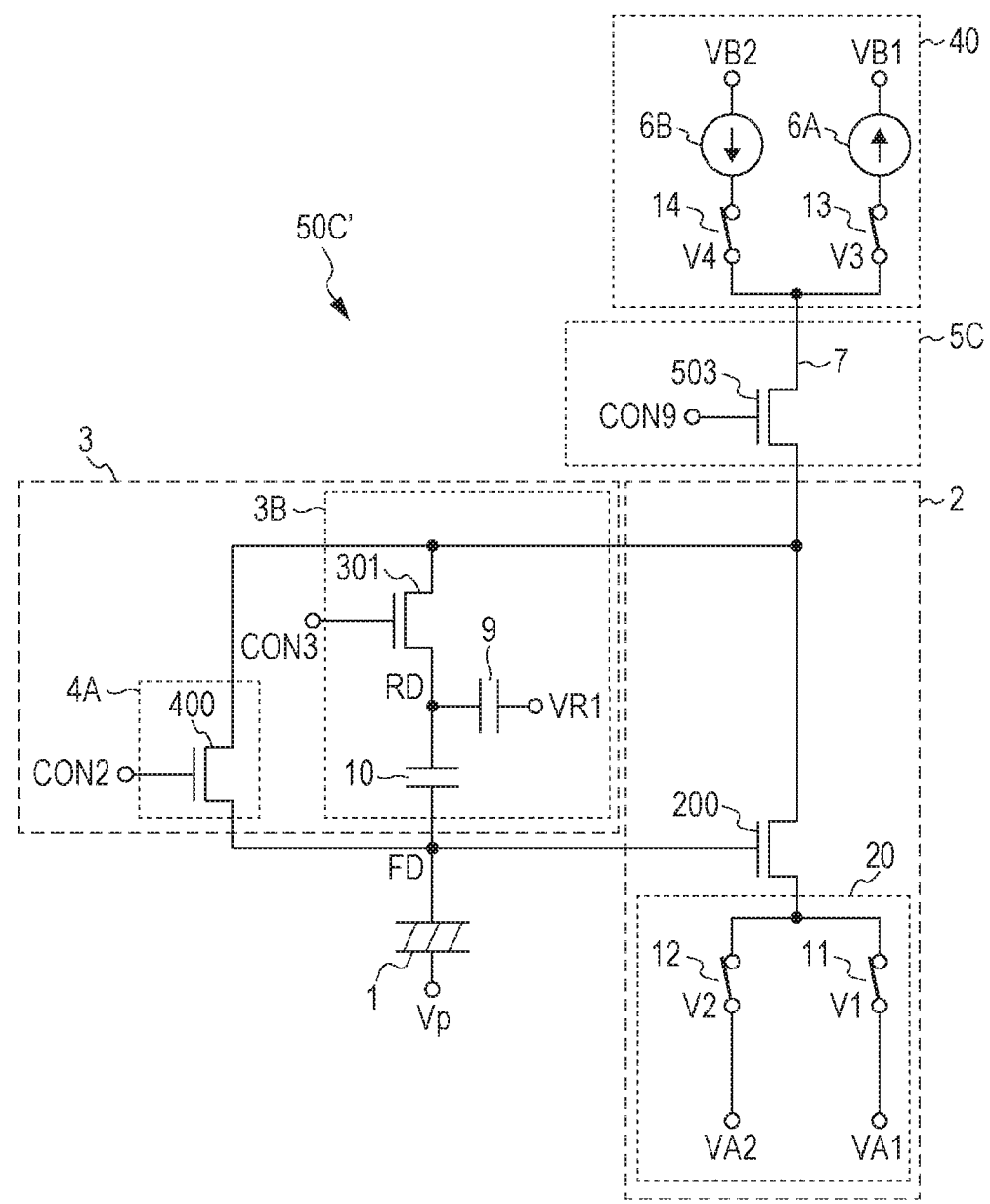
FIG. 21B is a schematic diagram illustrating another exemplary circuit configuration of the reading circuit according to the third embodiment.
Figure 22B:
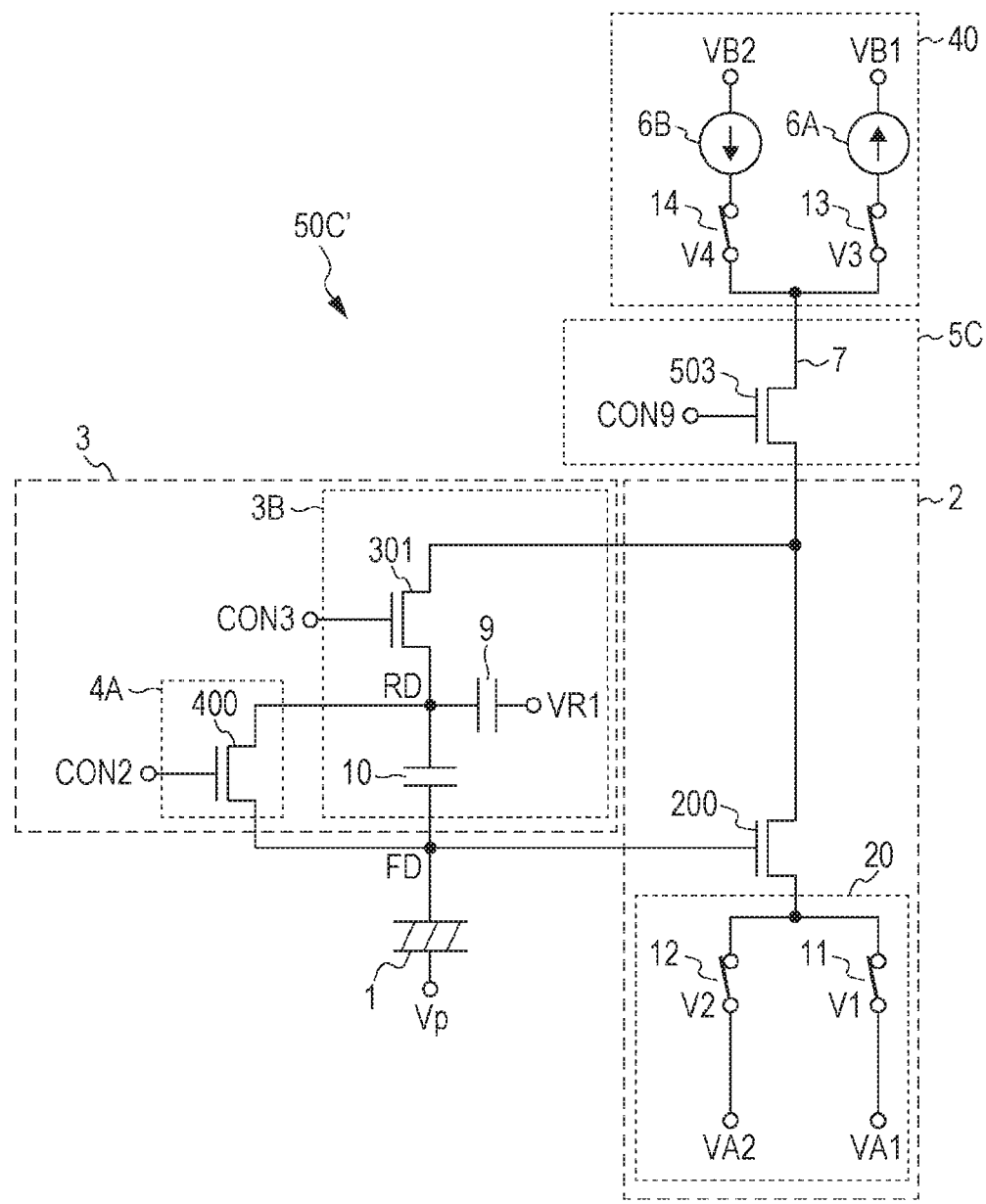
FIG. 22B is a schematic diagram illustrating another exemplary circuit configuration of the reading circuit according to the third embodiment.

The configuration in which the switching circuit 40 includes the constant current source 6B, the configuration being described above with reference to FIG. 19B, can also be applied to the configurations illustrated in FIGS. 21A and 22A. FIG. 21B illustrates a modification of the configuration illustrated in FIG. 21A, and FIG. 22B illustrates a modification of the configuration illustrated in FIG. 22A. In each of the modifications, the switching circuit 40 has a constant current source 6B in addition to a constant current source 6A. The output selector 5C also has a fourth selection transistor 503, which is an NMOS transistor. In the configurations illustrated in FIGS. 21A and 22A, current can be supplied from the constant current source 6B to the first amplification transistor 200 by turning on the fourth switching element 14 and the fourth selection transistor 503, as in the configuration illustrated in FIG. 19B.

Fourth Embodiment

The structure, functions, and a drive method of an imaging device 100 according to a fourth embodiment will be described with reference to FIGS. 23 to 27. The imaging device 100 according to the present embodiment has the following differences from the imaging devices 100 according to the first to third embodiments. First, an amplifier 2A in a reading circuit 50D has an amplification function and a band control function. Second, the amplifier 2A returns its output to its input end to thereby apply negative feedback by using its own amplification function (with an amplification factor of −A) while performing band control, to reduce the reset noise to $1/(1+A)^{1/2}$.

Figure 23:
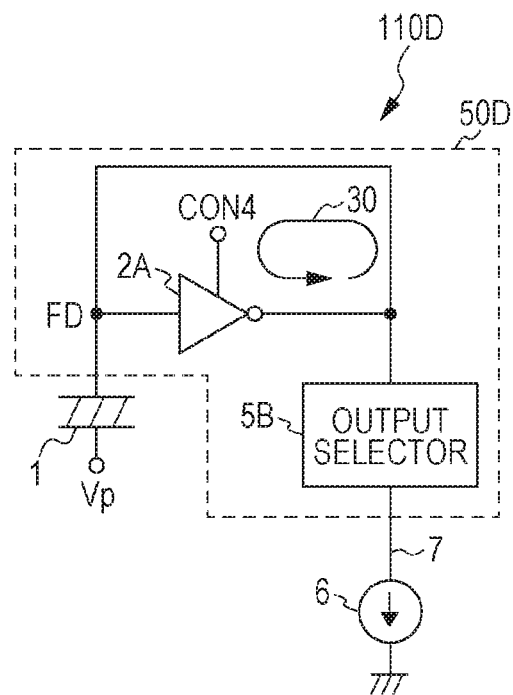
FIG. 23 is a schematic diagram illustrating an exemplary circuit configuration of each unit pixel cell in an imaging device according to a fourth embodiment.

FIG. 23 schematically illustrates an exemplary circuit configuration of each unit pixel cell 110D in the imaging device 100 according to the present embodiment. Each unit pixel cell 110D includes a photodetector 1 and a reading circuit 50D. The reading circuit 50D includes an amplifier 2A, an FD, and an output selector 5B. The output selector 5B is connected to a constant current source 6 through a signal reading line 7 and is driven by current from the constant current source 6. The amplifier 2A amplifies a signal corresponding to signal charge accumulated in the FD and performs band control in order to suppress kTC noise generated in the FD.

The structure and the functions of the reading circuit 50D will be described in detail with reference to FIG. 24.

Figure 24:
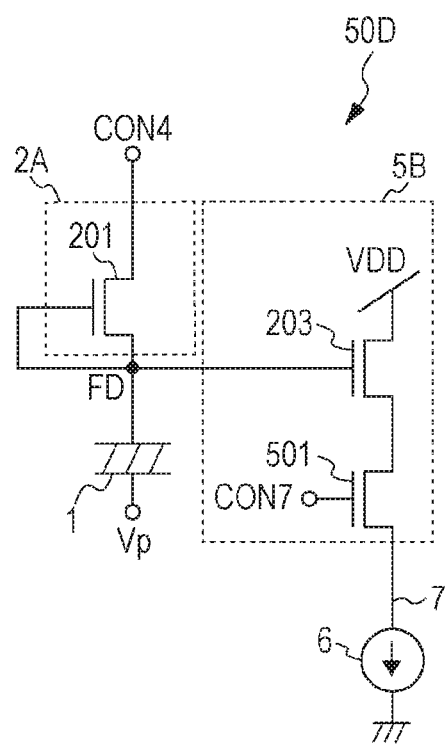
FIG. 24 is a schematic diagram illustrating an exemplary circuit configuration of a reading circuit according to the fourth embodiment.

FIG. 24 schematically illustrates one example of the circuit configuration of the reading circuit 50D. The amplifier 2A includes a second amplification transistor 201, and the output selector 5B includes a fourth amplification transistor 203 and a second selection transistor 501. The following description will be given of a relationship in electrical connections in the reading circuit 50D.

The gate of the second amplification transistor 201 and one of the source and the drain thereof are connected to the FD. The other of the source and the drain of the second amplification transistor 201 is connected to a fourth control signal line CON4. The second amplification transistor 201 amplifies a signal voltage corresponding to signal charge accumulated in the FD.

The FD is connected to the gate of the fourth amplification transistor 203. One of the source and the drain of the fourth amplification transistor 203 is connected to a power-supply voltage VDD or a reference voltage. The other of the source and the drain of the fourth amplification transistor 203 is connected to one of the source and the drain of the second selection transistor 501. The gate of the second selection transistor 501 is connected to the seventh control signal line CON7 which selects a row to be read out. The other of the source and the drain of the second selection transistor 501 is connected to the constant current source 6 through the signal reading line 7. In such a manner, the fourth amplification transistor 203, the second selection transistor 501, and the constant current source 6 form a source follower circuit. The second selection transistor 501 selectively outputs an output signal of the second amplification transistor 201 to outside through the signal reading line 7.

The gate of the second amplification transistor 201 and one of the source and the drain of the second amplification transistor 201 respectively correspond to an input end and an output end of the amplifier 2A. Thus, connection of the output end of the amplifier 2A to the input end thereof forms a feedback loop. Thus, the feedback circuit 30 negatively feeds back a signal, which is input from the photodetector 1, to the FD without involvement of the fourth amplification transistor 203.

Next, an operation flow of the reading circuit 50D will be described with reference to FIG. 25.

Figure 25:
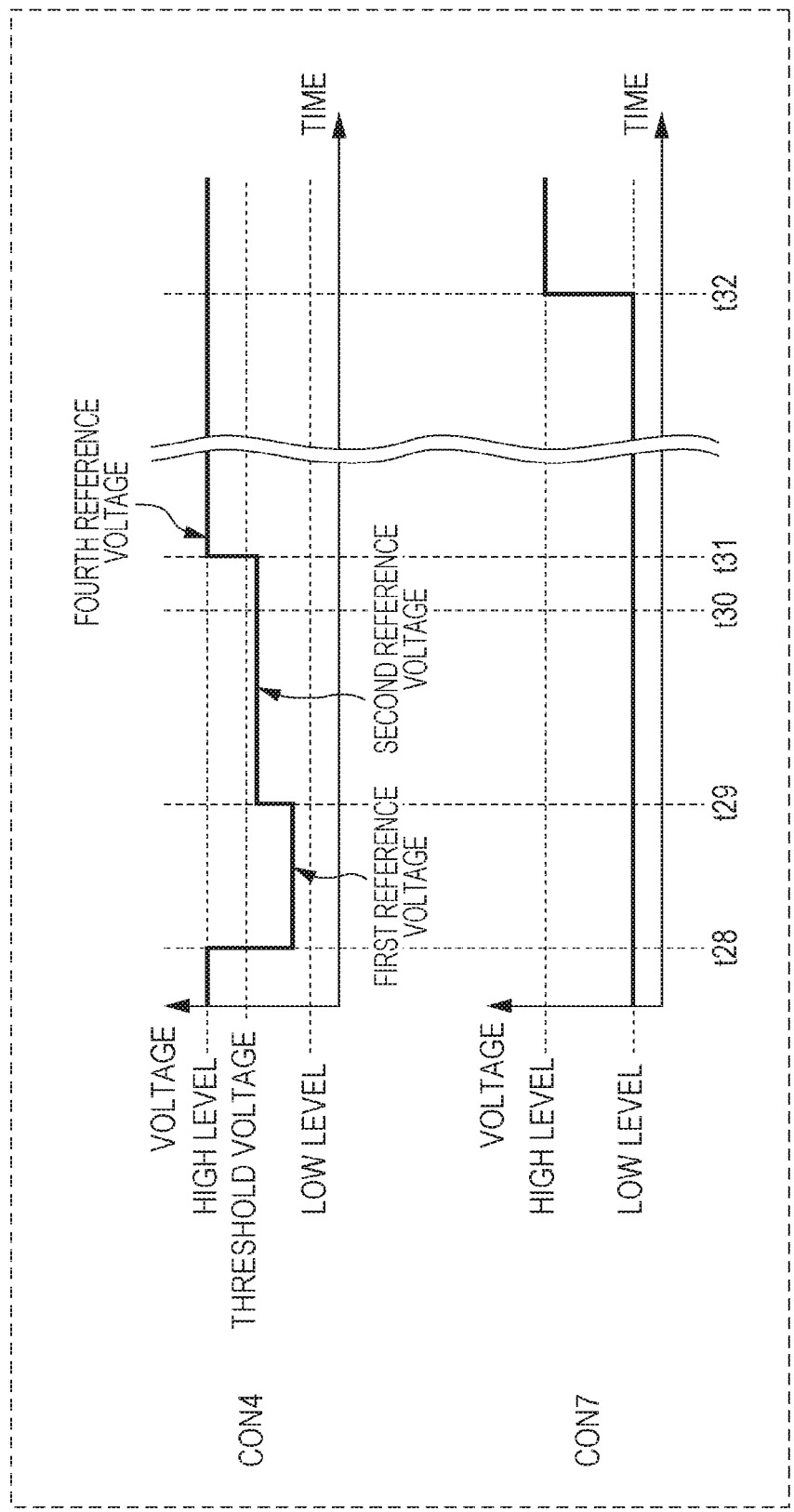
FIG. 25 is a timing chart illustrating one example of the operation of the reading circuit.

FIG. 25 is a timing chart illustrating one example of the operation of the reading circuit 50D. The horizontal axis in each graph represents time, and the vertical axes represent a voltage of the fourth control signal line CON4 and a voltage of the seventh control signal line CON7 sequentially from the top in FIG. 25.

(Reset Period)

At time t28, the voltage of the seventh control signal line CON7 is at the low level, so that the second selection transistor 501 is turned off. That is, the signal reading line 7 and the fourth amplification transistor 203 are electrically isolated from each other. In this state, the voltage of the fourth control signal line CON4 is set to a first reference voltage so that the FD has a voltage that is equal or close to a desired reset voltage VRST. At this point in time, the band of the second amplification transistor 201 is set to a third band, which is a wideband. As a result, the FD, the gate of the second amplification transistor 201, and one of the source and the drain of the second amplification transistor 201 are set to have a desired voltage at high speed. The third band means a band corresponding to the first reference voltage.

As the voltage of the FD gets closer to the reset voltage VRST, the amount of time taken for the noise suppression becomes smaller, thus making it possible to reduce the drive time. Accordingly, it is desirable that the voltage of the fourth control signal line CON4 be set so that the voltage of the FD is equal or close to the reset voltage VRST. However, the setting value of the voltage of the fourth control signal line CON4 is not limited to that value, if the drive time allows extra time. In the reset period, the second amplification transistor 201 functions as a reset transistor.

(Noise Suppression Period)

In the period of time t29 to time t31, the seventh control signal line CON7 remains at the low level, and the second selection transistor 501 is in the off state. That is, the signal reading line 7 and the fourth amplification transistor 203 remain, electrically isolated from each other. In this state, the voltage of the fourth control signal line CON4 is set to a second reference voltage. As a result, the state of the second amplification transistor 201 changes gradually from the on state to the off state. During the change, kTC noise is generated in the second amplification transistor 201. The kTC noise depends on a capacitance Cfd that is parasitic in the FD to which one of the source and the drain of the second amplification transistor 201 is connected. Thus, the noise is suppressed using the feedback loop involving the second amplification transistor 201. In the noise suppression period, the second amplification transistor 201 functions as a negative feedback transistor.

When the second reference voltage is set to a voltage with which the second amplification transistor 201 changes quickly from the on state to the off state, the band of reset noise that is generated increases to several terahertz. Thus, with the feedback loop involving the amplifier 2A, it is difficult to suppress high-frequency noise that exceeds the band of the amplifier 2A. In the period of time t29 to time t31, the second reference voltage is set so that the band of the second amplification transistor 201 is a fourth band, which is narrower than the third band. The fourth band means a band corresponding to the second reference voltage. This allows the band of the second amplification transistor 201 to be limited to the band of the amplifier 2A formed by the feedback loop involving the second amplification transistor 201. In addition, the reset noise generated in the second amplification transistor 201 can be efficiency suppressed in all bands.

After the noise is sufficiently reduced, at time t31, the voltage of the fourth control signal line CON4 is changed to a fourth reference voltage at which the second amplification transistor 201 is completely turned off. As a result, the feedback loop involving the second amplification transistor 201 is disconnected, and the voltage of the FD is stabilized in a state in which noise is suppressed.

Figure 26:
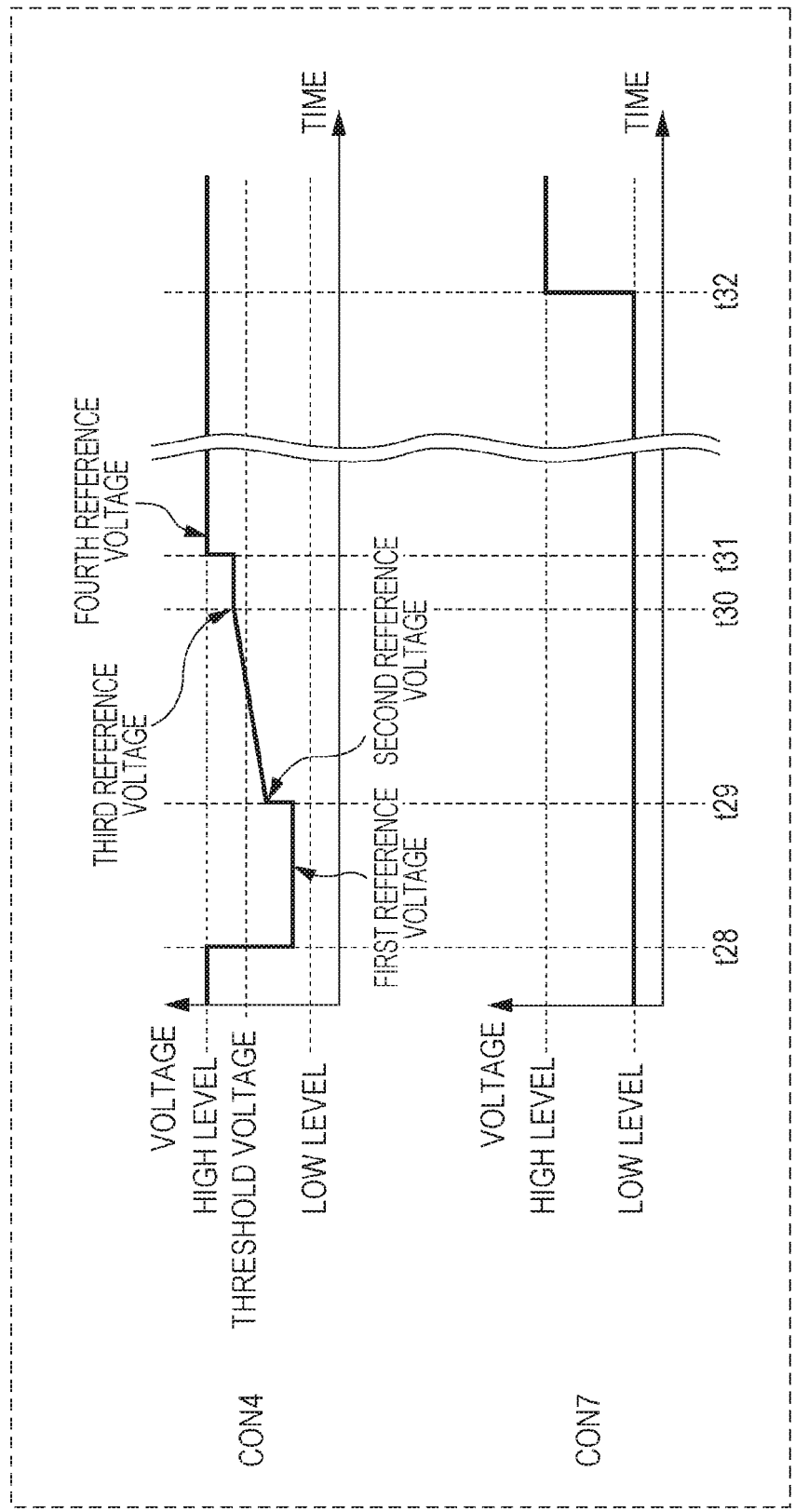
FIG. 26 is a timing chart illustrating another example of the operation of the reading circuit.

The taper reset described above with reference to FIGS. 8 and 17 may also be applied in the noise suppression period in the present embodiment. FIG. 26 is a timing chart illustrating one example of the operation of the reading circuit 50D when the taper reset is applied. As illustrated in FIG. 26, in the period of time t29 to time t30, the voltage of the fourth control signal line CON4 may be gradually changed so as to cross the threshold voltage in the range of the second reference voltage to a third reference voltage. As a result of the change, the second amplification transistor 201 changes gradually from the on state to the off state. In other words, in the period of time t29 to time t30, the voltage of the fourth control signal line CON4 is changed so that the band of the second amplification transistor 201 changes gradually from the fourth band to a fifth band. The fifth band means a band corresponding to the third reference voltage. The state of the second amplification transistor 201 is gradually changed from the on state to the off state while the band of the second amplification transistor 201 is limited to the band of the amplifier 2A formed by the feedback loop involving the second amplification transistor 201. As a result, noise generated in the FD can be suppressed in all bands. In this case, the fourth band and the fifth band are narrower than the third band. The second reference voltage and the third reference voltage may include predetermined margins, considering variations in manufacture among unit pixel cells.

(Exposure/Reading Period)

In a desired period when noise in the FD is sufficiently suppressed and the voltage is stable, signal charge is accumulated in the FD. Thereafter, at time t32, the second selection transistor 501 is turned on, so that the fourth amplification transistor 203 is electrically connected to the signal reading line 7. Thus, the fourth amplification transistor 203 and the constant current source 6 form a source follower circuit. The signal charge accumulated in the FD is amplified by the source follower circuit, and the amplified signal is output to the peripheral circuitry (such as a CDS circuit and an A/D circuit) through the signal reading line 7.

When a noise suppression ratio and stability during reading are considered, it is desirable to maximize the amplification factor of the amplifier 2A. For example, it is desirable to set the amplification factor of the amplifier 2A to a value larger than the amplification factor of the amplifier (source follower) in the output selector 5B.

According to the present embodiment, CDS can also be performed in order to cancel variations in the peripheral circuitry, as in the other embodiments. More specifically, at time t32, after the source follower circuit reads the signal voltage of the FD, the above-described reset operation is performed again. After the reset operation is completed, the source follower circuit performs the reset-voltage reading operation again, before the photodetector 1 detects light. Thus, the reset voltage VRST can be read. It is possible to perform CDS by obtaining the difference between the signal voltage of the FD and the reset voltage.

In the present embodiment, since the source follower circuit reads the signal in the FD in the exposure period, the amplification factor is about 1. The present disclosure, however, is not limited to this amplification factor, and the designer may vary the amplification factor in accordance with an SNR or a circuit range needed for the system.

According to the present embodiment, the feedback for noise cancelling is completed in each unit pixel cell, as in the first to third embodiments. This allows the noise cancelling to be performed at high speed without being affected by the time constant of the signal reading line 7. In addition, the amplifier 2A has both the amplification function and the band control function. This makes it possible to reduce the area of each unit pixel cell and makes it possible to meet a demand for a narrower unit pixel cell. This is a noteworthy feature of the present embodiment. Even in an imaging device having a small pixel area, it is possible to effectively suppress noise in the FD without increasing the number of constituent elements.

In the present embodiment, in the reset period and the noise suppression period, the second selection transistor 501 is turned off, so that the fourth amplification transistor 203 is isolated from the signal reading line 7. However, the present disclosure is not limited to this operation, and for example, the signal may be read at a timing different from the above-described timing. In such a case, the reading may be performed while the second selection transistor 501 is in the on state. If the drive time allows extra time, only the operations in the noise suppression period and the exposure/reading period may be performed by omitting the reset period and without performing driving for reducing a convergence time for suppressing the reset noise. The signal reading line 7 and/or the constant current source 6 may be provided for each unit pixel cell or may be shared by a plurality of unit pixel cells.

Figure 27:
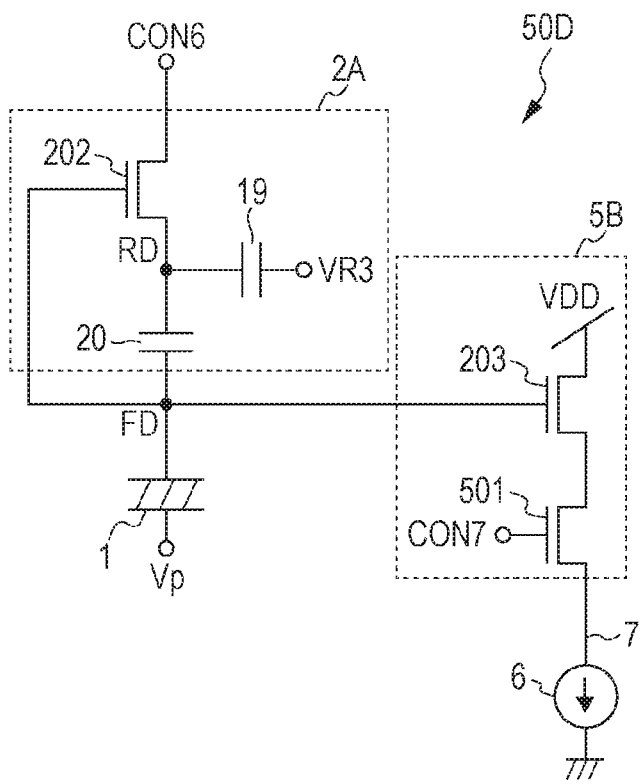
FIG. 27 is a schematic diagram illustrating another exemplary circuit configuration of the reading circuit according to the fourth embodiment.

The following description will be given of a modification of the configuration and the operation of the reading circuit 50D according to the present embodiment. FIG. 27 schematically illustrates another example of the circuit configuration of the reading circuit 50D. What is noteworthy in the configuration of this modification is that the amplifier 2A includes a third capacitor 19 and a fourth capacitor 20, in addition to a third amplification transistor 202. The gate of the third amplification transistor 202 is connected to the FD. One of the source and the drain of the third amplification transistor 202 is connected to a sixth control signal line CON6. The other of the source and the drain of the third amplification transistor 202 is connected to one end of the third capacitor 19 and one end of the fourth capacitor 20. The other end of the third capacitor 19 is connected to the third reference voltage VR3. The other end of the fourth capacitor 20 is connected to the FD. A node RD is formed among the third amplification transistor 202, the third capacitor 19, and the fourth capacitor 20.

According to the configuration in this modification, the gate of the third amplification transistor 202 and the other end of the fourth capacitor 20 respectively correspond to an input end and an output end of the amplifier 2A. Connection of the output end to the input end of the amplifier 2A forms a negative feedback loop. When the amplification factor of the amplifier 2A is represented by −A, reset noise generated by the third amplification transistor 202 can be reduced to $1/(1+A)^{1/2}$.

A first advantage of this modification is that kTC noise generated by the third amplification transistor 202 can be reduced to $(kT/C3)^{1/2} < (kT/Cfd)^{1/2}$ by setting a capacitance C3 of the third capacitor 19 to a value larger than the capacitance Cfd of the FD. A second advantage is that, when a capacitance C4 of the fourth capacitor 20 is set to be smaller than the capacitance of the FD, the amount of noise in the FD can be attenuated to C4/(Cfd+C4) by divided voltages of the capacitance Cfd of the FD and the capacitance C4 of the fourth capacitor 20.

An advantage obtained by this modification is specifically compared with an advantage of the configuration illustrated in FIG. 24. In the configuration illustrated in FIG. 24, when the gain of the amplifier 2A is represented by A, and the gain of the second amplification transistor 201 is represented by A', the reset noise in the second amplification transistor 201 is reduced to $1/(1+A)^{1/2} = 1/(1+A')^{1/2}$. On the other hand, in this modification, when the gain of the amplifier 2A is represented by A, and the gain of the third amplification transistor 202 is represented by A', the reset noise in the third amplification transistor 202 is reduced to $1/(1+A)^{1/2} = 1/[1+A' \times \{C4/(Cfd+C4)\} \times (C3/Cfd)]^{1/2}$. Thus, compared with the configuration illustrated in FIG. 24, it is possible to significantly reduce the reset noise.

With respect to suppression of noise, typically, when the capacitance C3 of the third capacitor 19 is increased, the random noise is reduced. However, when the FD converts signal charge to a signal voltage, the signal level decreases, and consequently, the SNR is not improved. However, according to this modification, since the FD and the RD are separated by the fourth capacitor 20, the signal level does not decrease even when the capacitance is increased. Hence, since only the random noise is suppressed, the SNR is improved.

Next, a reading operation in the imaging device 100 according to this modification will be described while paying attention to differences from the drive method illustrated in FIG. 25 or 26.

The sixth control signal line CON6 is connected to the amplifier 2A. In principle, a signal that is the same as the signal in the fourth control signal line CON4 illustrated in FIG. 25 is input to the sixth control signal line CON6. A fifth reference voltage, instead of the sixth control signal line CON6, may be set as the third reference voltage VR3, and the voltage of the other of the source and the drain of the third amplification transistor 202 may be changed. Alternatively, the node RD may be directly controlled. In this case, the fifth reference voltage corresponds to the second reference voltage.

Also, a voltage that changes gradually from the on state to the off state across the threshold for the third amplification transistor 202 may be input to the sixth control signal line CON6, as in the fourth control signal line CON4 in FIG. 26. That is, in the period of time t29 to time t30, the voltage of the sixth control signal line CON6 may be gradually changed so as to cross the threshold voltage in the range of the second reference voltage to the third reference voltage. Alternatively, in the period of time t29 to time t30, instead of the sixth control signal line CON6, a voltage that changes from the fifth reference voltage to a sixth reference voltage may be set as the third reference voltage VR3, and the voltage of the other of the source and the drain of the third amplification transistor 202 may be changed. Alternatively, the node RD may be directly controlled. In this case, the sixth reference voltage corresponds to the third reference voltage.

According to this modification, compared with the configuration illustrated in FIG. 24, the noise suppression ratio can be significantly improved by the effects of the third capacitor 19 and the fourth capacitor 20.

Since the two capacitances are arranged, the noise suppression effect increases. However, the arrangement area also increases. Since the suppression effect varies depending on the presence/absence of a capacitor and the absolute value of a capacitance, the designer can perform design through selection of an arbitrary configuration and values.

Fifth Embodiment

The structure, functions, and a drive method of an imaging device 100 according to a fifth embodiment will be described with reference to FIGS. 28 to 34. The imaging device 100 according to the present embodiment differs from the imaging device 100 according to the fourth embodiment in that a switching unit 4B is added to the reading circuit 50D according to the fourth embodiment. The following description will be mainly given of differences from the fourth embodiment.

Figure 28:
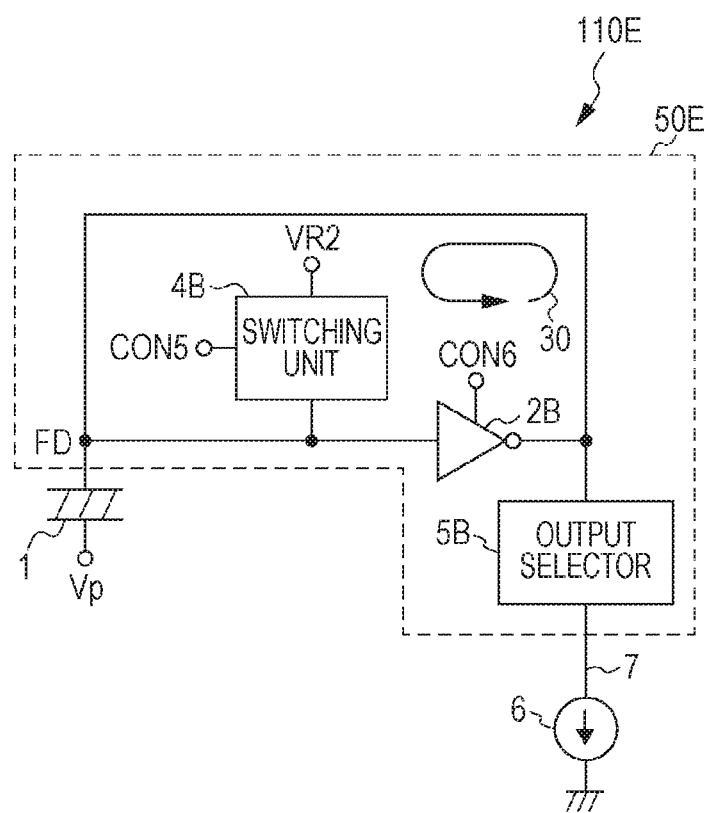
FIG. 28 is a schematic diagram illustrating an exemplary circuit configuration of each unit pixel cell in an imaging device according to a fifth embodiment.
Figure 29:
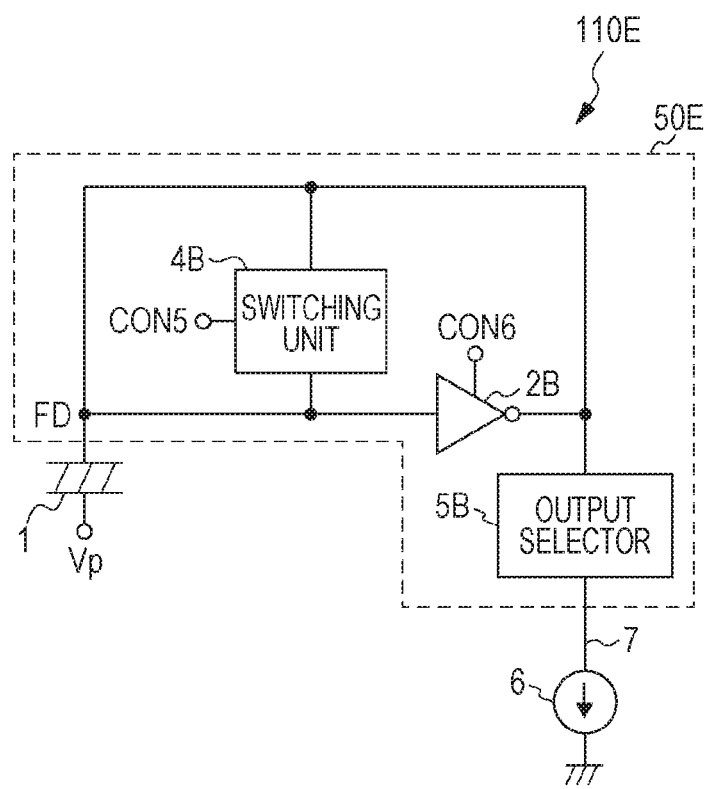
FIG. 29 is a schematic diagram illustrating another exemplary circuit configuration of the unit pixel cell in the imaging device according to the fifth embodiment.

FIGS. 28 and 29 each schematically illustrate an exemplary circuit configuration of each unit pixel cell 110E in the imaging device 100 according to the present embodiment. Each unit pixel cell 110E includes a photodetector 1 and a reading circuit 50E. The reading circuit 50E includes an amplifier 2B, an FD, a switching unit 4B, and an output selector 5B.

The structure and functions of the reading circuit 50E will be described with reference to FIG. 30.

Figure 30:
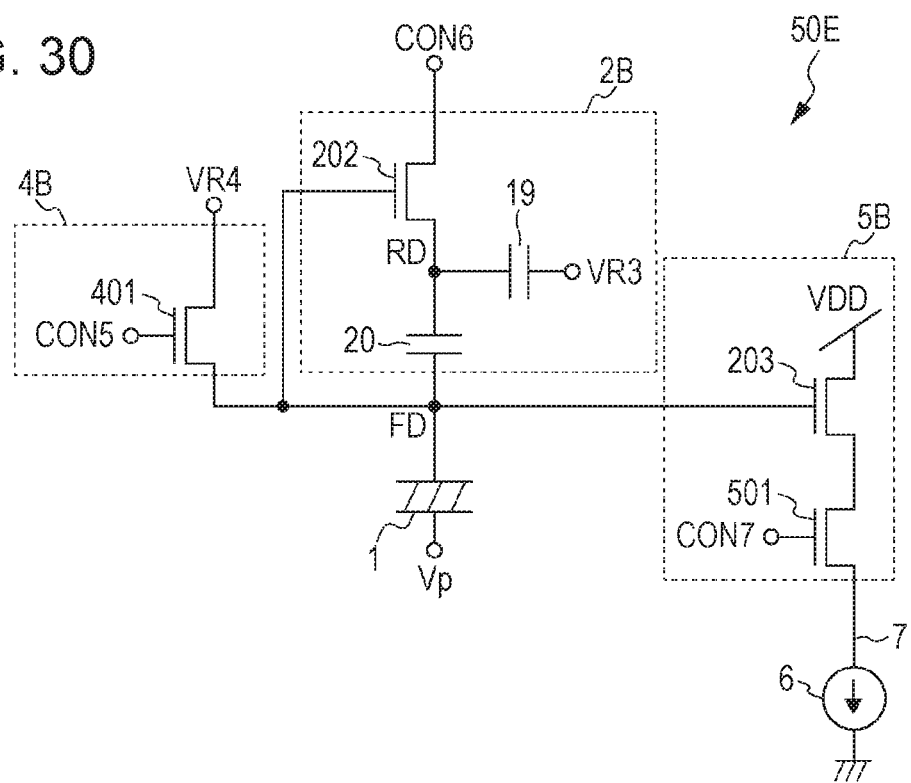
FIG. 30 is a schematic diagram illustrating an exemplary circuit configuration of a reading circuit according to the fifth embodiment.

FIG. 30 schematically illustrates one example of the circuit configuration of the reading circuit 50E. The switching unit 4B includes a switch transistor 401. A fifth control signal line CON5 is connected to the gate of the switch transistor 401. The FD is connected to one of the source and the drain of the switch transistor 401. The fourth reference voltage VR4 is connected to the other of the source and the drain of the switch transistor 401. The sixth control signal line CON6 is connected to one of the source and the drain of the third amplification transistor 202.

Next, an operation flow of the reading circuit 50E will be described with reference to FIG. 31.

Figure 31:
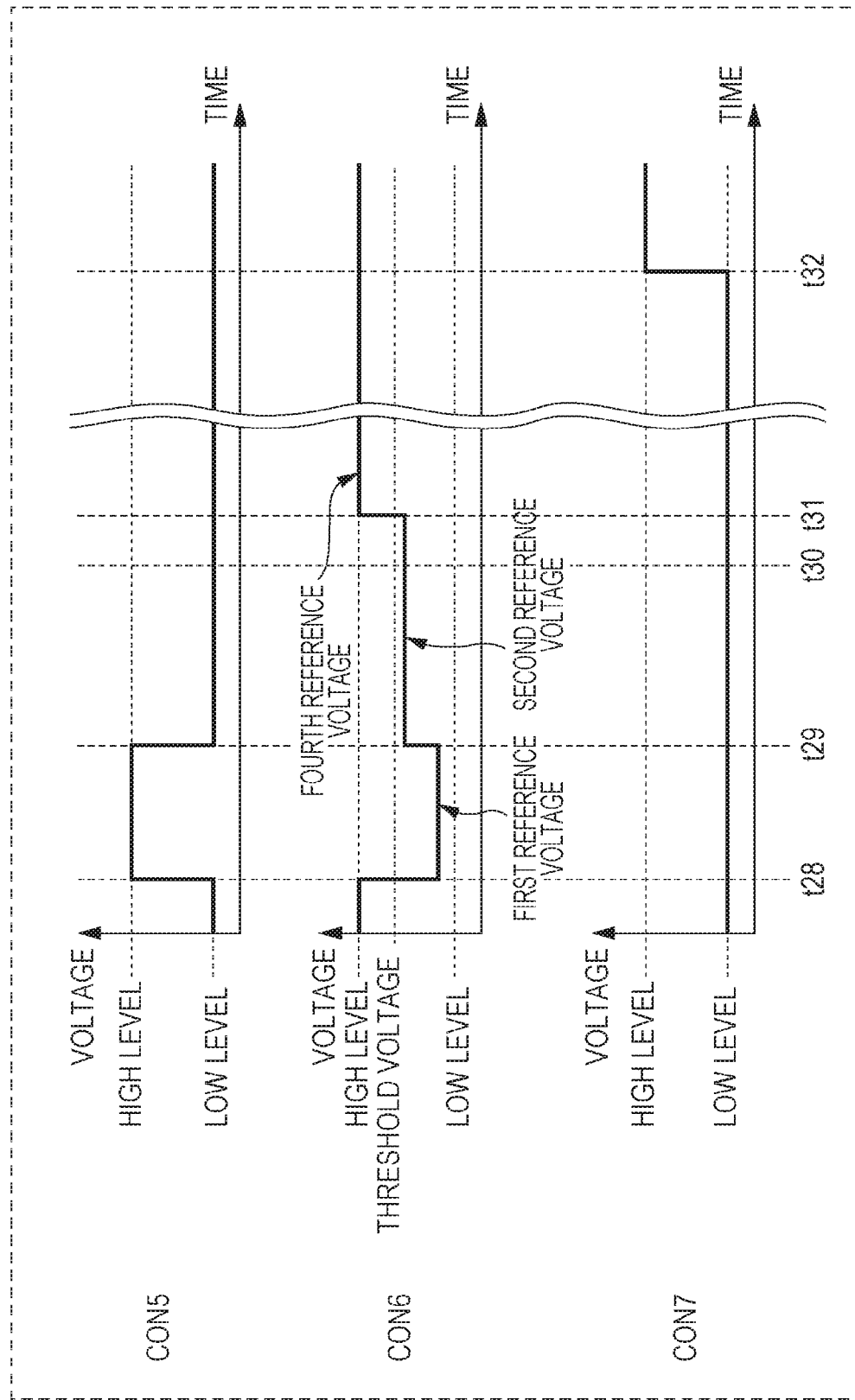
FIG. 31 is a timing chart illustrating one example of the operation of the reading circuit.

FIG. 31 is a timing chart illustrating one example of the operation of the reading circuit 50E. The horizontal axis in each graph represents time, and the vertical axes represent a voltage of the fifth control signal line CON5, a voltage of the sixth control signal line CON6, and a voltage of the seventh control signal line CON7 sequentially from the top in FIG. 31.

(Reset Period)

At time t28, the voltage of the fifth control signal line CON5 is set to the high level to turn on the switch transistor 401. At this point in time, the fourth reference voltage VR4 and the FD are connected to each other. Also, at time t28, the voltage of the seventh control signal line CON7 is at the low level, and the second selection transistor 501 is in the off state. That is, the fourth amplification transistor 203 is electrically isolated from the signal reading line 7. In this state, the sixth control signal line CON6 is set to have the first reference voltage so that the FD has a voltage that is equal or close to a desired reset voltage VRST (=VR4). In this case, when the band of the third amplification transistor 202 is set to the third band, which is a wideband, the FD, the gate of the third amplification transistor 202, and the other of the source and the drain of the third amplification transistor 202 are set to have a desired voltage at high speed.

As the voltage of the FD gets closer to the reset voltage VRST, the amount of time taken for the noise suppression becomes smaller, thus making it possible to reduce the drive time. Thus, it is desirable that a voltage be applied to the sixth control signal line CON6 so that the voltage of the FD is equal or close to the reset voltage VRST. However, if the drive allows extra time, the setting value of the voltage is not limited to that value.

At time t29, the voltage of the fifth control signal line CON5 is set to the low level to turn off the switch transistor 401 so as to cause the fourth reference voltage VR4 and the FD to be disconnected from each other.

(Noise Suppression Period)

In the state in which the switch transistor 401 is turned off and the fourth reference voltage VR4 and the FD are disconnected from each other, the noise suppression operation and an operation for reading the signal level or the reset level are performed.

In the period of time t29 to time t31, the seventh control signal line CON7 remains at the low level, and the second selection transistor 501 has been turned off. That is, the signal reading line 7 and the fourth amplification transistor 203 remain electrically isolated from each other. In this state, the voltage of the sixth control signal line CON6 is set to the second reference voltage. As a result, the state of the third amplification transistor 202 changes gradually from the on state to the off state.

In the period of time t29 to time t31, the second reference voltage is set so that the band of the third amplification transistor 202 is the fourth band, which is narrower than the third band. This allows the band of the third amplification transistor 202 to be limited to the band of the amplifier 2B formed by the feedback loop involving the third amplification transistor 202. In addition, the reset noise generated in the third amplification transistor 202 can be efficiency suppressed in all bands.

After the noise is sufficiently reduced, at time t31, the voltage of the sixth control signal line CON6 is changed to the fourth reference voltage with which the third amplification transistor 202 is completely turned off. The feedback loop involving the third amplification transistor 202 is disconnected, and the voltage of the FD is stabilized in a state in which the noise is suppressed.

Figure 32:
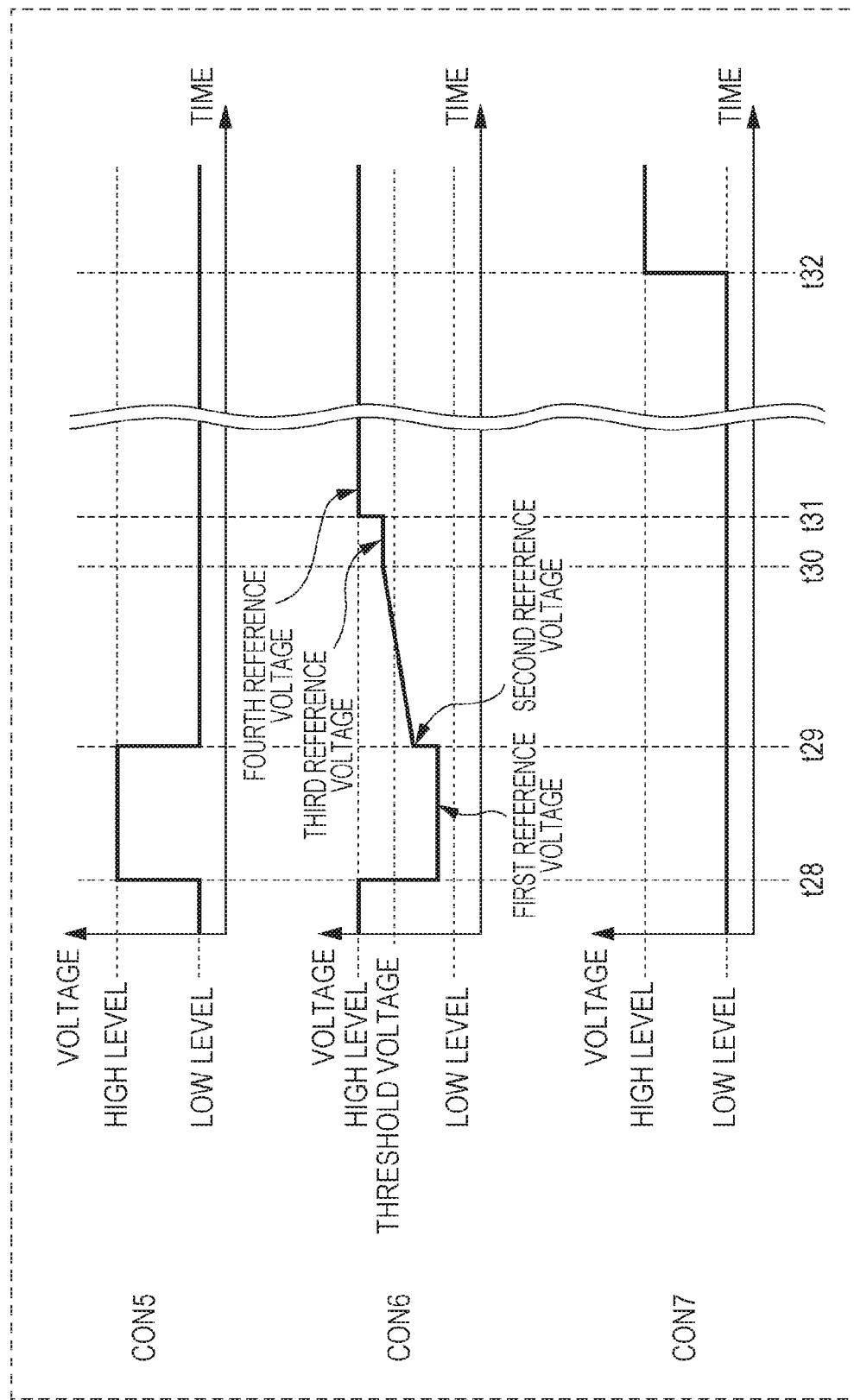
FIG. 32 is a timing chart illustrating another example of the operation of the reading circuit.

The taper reset described above with reference to FIGS. 8 and 17 may also be applied in the noise suppression period in the present embodiment. FIG. 32 is a timing chart illustrating one example of the operation of the reading circuit 50E when the taper reset is applied. As illustrated in FIG. 32, in the period of time t29 to time t30, the voltage of the sixth control signal line CON6 may be gradually changed so as to cross the threshold voltage in the range of the second reference voltage to the third reference voltage. The state of the third amplification transistor 202 changes gradually from the on state to the off state. As a result, noise generated in the FD can be suppressed in all bands.

(Exposure/Reading Period)

In a desired period when noise in the FD is sufficiently suppressed and the voltage is stable, signal charge is accumulated in the FD. Thereafter, at time t32, the second selection transistor 501 is turned on, so that the fourth amplification transistor 203 is electrically connected to the signal reading line 7. Thus, the fourth amplification transistor 203 and the constant current source 6 form a source follower circuit. The signal charge accumulated in the FD is amplified by the source follower circuit, and the amplified signal is output to the peripheral circuitry (such as a CDS circuit and an A/D circuit) through the signal reading line 7.

In the present embodiment, controlling the switch transistor 401 makes it easy to set the FD to have a desired reset voltage VRST at high speed.

In the fourth embodiment, the gain of the amplifier 2A is −A, and reset noise generated by the second amplification transistor 201 or the third amplification transistor 202 is fed back while band limitation is applied. As a result, the reset noise is reduced to $1/(1+A)^{1/2}$.

In contrast, according to the present embodiment, since the feedback is performed after the switch transistor 401 is turned off, the reset noise generated by the switch transistor 401 can be significantly reduced to $1/(1+A)^{1/2}$. The reset noise generated by the third amplification transistor 202 is also reduced to $1/(1+A)^{1/2}$ by performing the feedback while applying the band limitation. In addition, as in the modification in the fourth embodiment, when the capacitance C3 of the third capacitor 19 is set to a value larger than the capacitance Cfd of the FD, kTC noise generated by the third amplification transistor 202 can be reduced to $(kT/C3)^{1/2} < (kT/Cfd)^{1/2}$. In addition, when the fourth capacitor 20 is set to be smaller than the capacitance Cfd in the FD, the amount of noise in the FD can be attenuated to C4/(Cfd+C4) by divided voltages of the capacitance Cfd of the FD and the capacitance C4 of the fourth capacitor 20.

An advantage offered by the present embodiment is specifically compared with an advantage offered by the configuration described above in the fourth embodiment and illustrated in FIGS. 24 and 27. According to the configuration illustrated in FIG. 24, when the gain of the amplifier 2A is represented by A, and the gain of the second amplification transistor 201 is represented by A', the reset noise in the second amplification transistor 201 is reduced to $1/(1+A)^{1/2} = 1/(1+A')^{1/2}$. In contrast, according to the configuration illustrated in FIG. 27, when the gain of the amplifier 2A is represented by A, and the gain of the third amplification transistor 202 is represented by A', the reset noise in the third amplification transistor 202 is reduced to $1/(1+A)^{1/2} = 1/[1+A' \times \{C4/(Cfd+C4)\} \times (C3/Cfd)]^{1/2}$. Thus, the reset noise can be suppressed compared with the configuration illustrated in FIG. 24.

On the other hand, according to the present embodiment, when the gain of the amplifier 2B is represented by A, and the gain of the third amplification transistor 202 is represented by A', the reset noise in the switch transistor 401 is reduced to $1/(1+A) = 1/[1+A' \times \{C4/(Cfd+C4)\}]$. The reset noise in the third amplification transistor 202 is also reduced to $1/(1+A)^{1/2} = 1/[1A' \times \{C4/(Cfd+C4)\} \times (C3/Cfd)]^{1/2}$. Since the total noise can be obtained from a square root of the sum of squares of these noise components, the reset noise can be significantly reduced compared with the fourth embodiment.

According to the present embodiment, compared with the fourth embodiment, the reset noise can be significantly reduced by the effects of the third capacitor 19 and the fourth capacitor 20. Also, the provision of the switching unit 4B makes it easier to perform resetting and noise suppression at high speed.

As described above, the provision of the third capacitor 19, the fourth capacitor 20, and the switching unit 4B provides a greater noise suppression effect. However, the arrangement area also increases. Since the noise suppression effect depends on the presence/absence of a capacitor and the absolute value of a capacitance, the designer can perform design through selection an arbitrary configuration and the absolute value of a capacitance.

The following description will be given of a modification of the reading circuit 50E according to the present embodiment.

Figure 33:
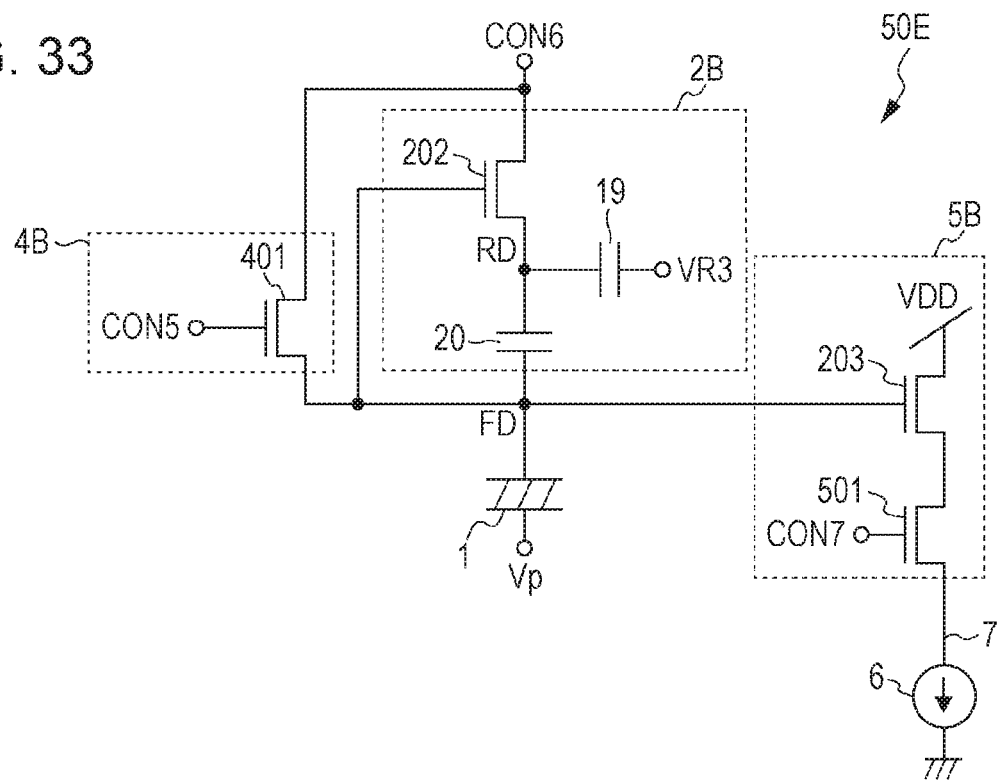
FIG. 33 is a schematic diagram illustrating another exemplary circuit configuration of the reading circuit according to the fifth embodiment.
Figure 34:
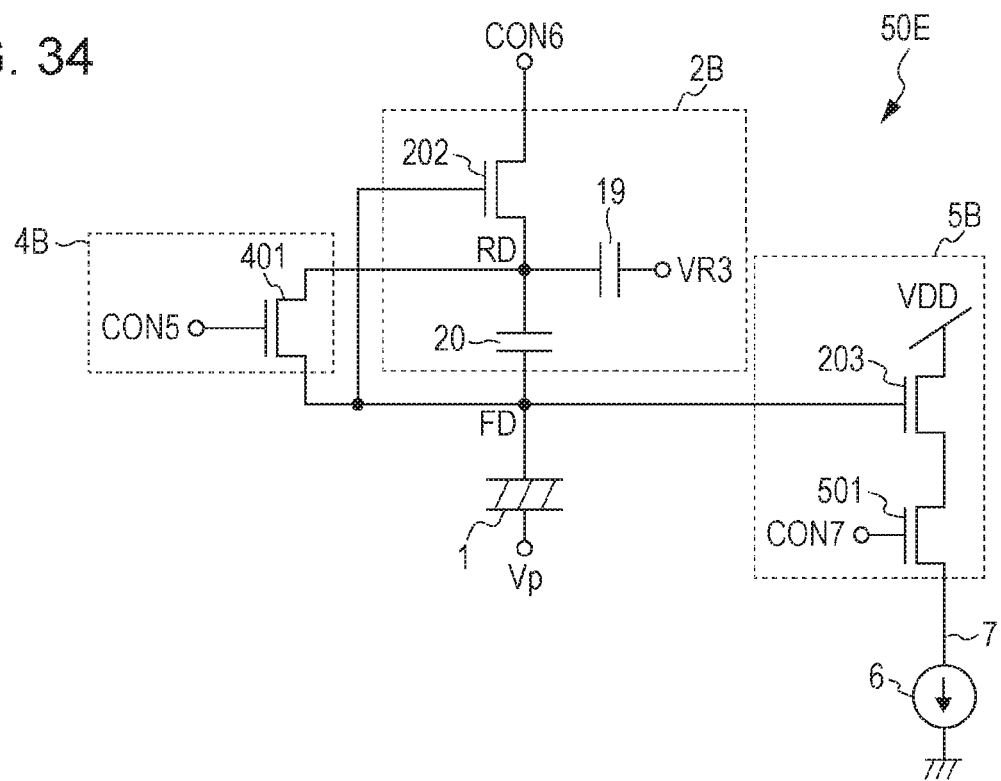
FIG. 34 is a schematic diagram illustrating another circuit configuration of the reading circuit according to the fifth embodiment.

FIGS. 33 and 34 schematically illustrate other exemplary circuit configurations of the reading circuit 50E. As illustrated in FIG. 33, one of the source and the drain of the switch transistor 401 may be connected to the FD, and the other of the source and the drain of the switch transistor 401 may be connected to the sixth control signal line CON6. With this configuration, it is possible to execute resetting without applying the fourth reference voltage VR4 and it is possible to provide advantages that are similar to those in the configuration illustrated in FIG. 30.

Also, as another modification of the switching unit 4B, one of the source and the drain of the switch transistor 401 may be connected to the FD, and the other of the source and the drain of the switch transistor 401 may be connected to a node (RD) of the third capacitor 19 and the fourth capacitor 20, as illustrated in FIG. 34. With this configuration, it is possible to execute resetting without applying the fourth reference voltage VR4, and it is possible to provide advantages that are similar to those in the configuration illustrated in FIG. 30. According to this configuration, in particular, since the gate of the third amplification transistor 202 and the other of the source and the drain of the third amplification transistor 202 can be set to have the same voltage, the time of the noise cancellation can be reduced.

Although the operation of the feedback circuit 30 or 30' involving the negative feedback has been described above in the first to fifth embodiments, the feedback is not limited thereto. Positive feedback may also be added to the feedback. For example, after positive feedback is applied, negative feedback may be applied to suppress noise, or the feedbacks may be performed in the reverse order thereof to suppress noise. Also, noise may be suppressed while applying positive feedback and negative feedback at the same time. Use of the positive feedback in conjunction with the negative feedback makes it possible to increase the speed and the efficiency of the noise suppression.

Sixth Embodiment

A camera system 600 according to a sixth embodiment will be described with reference to FIG. 35.

Figure 35:
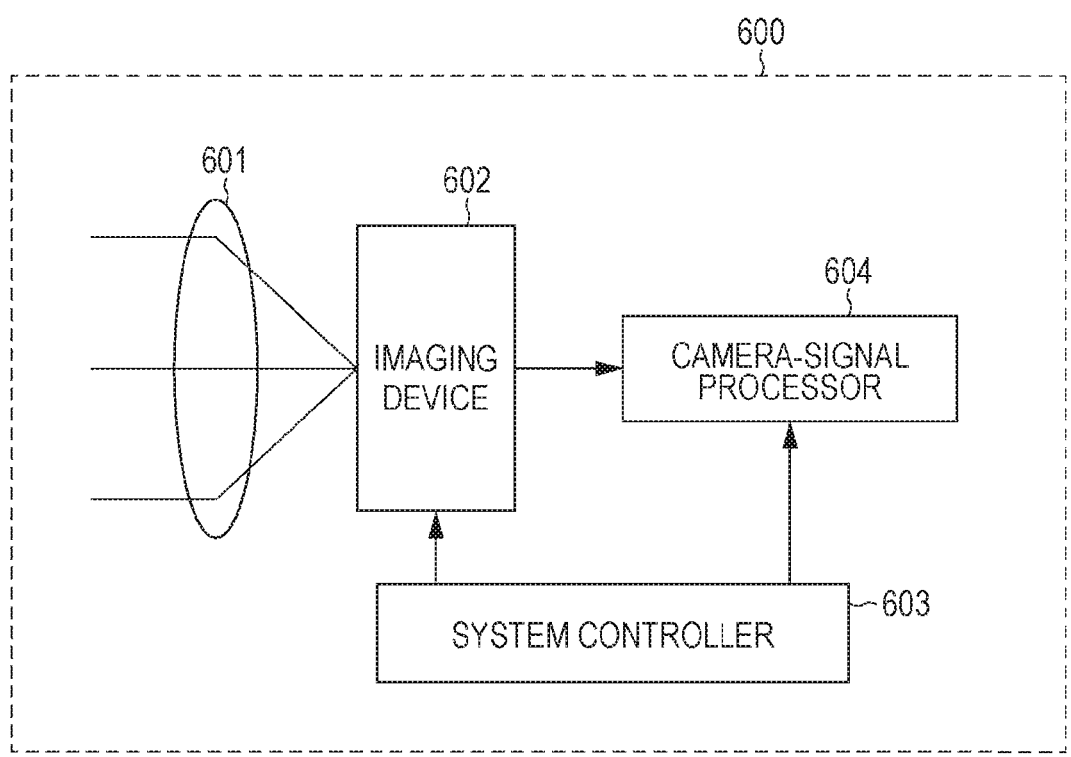
FIG. 35 is a schematic diagram illustrating a camera system according to a sixth embodiment.

FIG. 35 schematically illustrates an example of the configuration of the camera system 600 according to the present embodiment. The camera system 600 has a lens optical system 601, an imaging device 602, a system controller 603, and a camera-signal processor 604.

The lens optical system 601 includes, for example, a lens for autofocus, a lens for zoom, and a diaphragm. The lens optical system 601 condenses light on an image capture plane of the imaging device 602. The imaging device described above in each of the first to fifth embodiments can be widely used as the imaging device 602.

The system controller 603 controls the entire camera system 600. The system controller 603 is implemented by, for example, a microcomputer.

The camera-signal processor 604 functions as a signal processing circuit for processing a signal output from the imaging device 602. The camera-signal processor 604 performs processing, for example, gamma correction, color interpolation processing, space interpolation processing, and automatic white balancing. The camera-signal processor 604 can be implemented by, for example, a digital signal processor (DSP).

According to the camera system in the present embodiment, when the imaging device according to any of the first to fifth embodiments is used, it is possible to appropriately suppress reset noise (kTC noise) during reading. As a result, charge can be correctly read, and a good image can be obtained.

The imaging device according to the present disclosure can be applied to various sensor systems and camera systems, such as digital still cameras, medical cameras, cameras for monitoring, vehicle-mounted cameras, digital single-lens reflex cameras, and digital mirrorless interchangeable lens cameras.

What is claimed is:

1. An imaging device comprising:
   a pixel including:
      a photoelectric converter that generates an electric signal through photoelectric conversion of incident light;
      a first transistor that has a gate coupled to the photoelectric converter and that amplifies the electric signal; and
      a second transistor that has a gate coupled to the photoelectric converter, one of a source and a drain of the second transistor being coupled to the photoelectric converter;
   a first voltage supply circuit configured to supply two or more different voltages to the other of the source and the drain of the second transistor; and
   a second voltage supply circuit configured to supply a voltage to one of a source and a drain of the first transistor independently of the first voltage supply circuit.

2. The imaging device according to claim 1, wherein the electric signal is fed back through the second transistor.

3. The imaging device according to claim 1, wherein the electric signal is fed back without passing through the first transistor.

4. The imaging device according to claim 1, wherein the first voltage supply circuit is configured to supply two or more different voltages to the other of the source and the drain of the second transistor in a period for initializing the electric signal.

5. The imaging device according to claim 4, wherein the period includes a reset period for resetting the electric signal and a noise reduction period for reducing a reset noise.

6. The imaging device according to claim 1, wherein
   the first voltage supply circuit supplies a first voltage in a period, and
   the second voltage supply circuit supplies a second voltage different from the first voltage in the period.

7. An imaging device comprising:
a pixel including:
- a photoelectric converter that generates an electric signal through photoelectric conversion of incident light;
- a first transistor that has a gate coupled to the photoelectric converter and that amplifies the electric signal;
- a second transistor that has a gate coupled to the photoelectric converter;
- a first capacitor that has a first terminal and a second terminal, the first terminal being coupled to one of a source and a drain of the second transistor; and
- a second capacitor that has a third terminal and a fourth terminal, the third terminal being coupled to the photoelectric converter, the fourth terminal being coupled to the one of the source and the drain of the second transistor, wherein
- a capacitance value of the first capacitor is greater than a capacitance value of the second capacitor.

8. The imaging device according to claim 7, wherein the electric signal is fed back through the second transistor and the second capacitor.

9. The imaging device according to claim 8, wherein the electric signal is fed back without passing through the first transistor.

10. The imaging device according to claim 7, wherein the first capacitor and the second capacitor are coupled in series between the photoelectric converter and a reference voltage.

11. The imaging device according to claim 7, further comprising a voltage supply circuit configured to supply two or more different voltages to the other of the source and the drain of the second transistor.

12. An imaging device comprising:
a pixel including:
- a photoelectric converter that generates an electric signal through photoelectric conversion of incident light;
- a first transistor that has a gate coupled to the photoelectric converter and that amplifies the electric signal;
- a second transistor that has a gate coupled to the photoelectric converter; and
- a first capacitor that has a first terminal and a second terminal, the first terminal being coupled to one of a source and a drain of the second transistor; and
- an insulating layer that electrically insulates the one of the source and the drain of the second transistor from the photoelectric converter, wherein
- the first terminal is insulated from the gate of the second transistor and the photoelectric converter.

13. The imaging device according to claim 12, wherein the electric signal is fed back through the second transistor.

14. The imaging device according to claim 12, wherein a reference voltage is applied to the second terminal of the first transistor.

15. The imaging device according to claim 12, wherein a capacitance value of the first capacitor is greater than a capacitance value between a first connecting node and a second connecting node, the first connecting node being a connecting node among the photoelectric converter, the gate of the first transistor, and the gate of the second transistor, the second connecting node being a connecting node between the one of the source and the drain of the second transistor and the first terminal of the first capacitor.

16. The imaging device according to claim 12, wherein the pixel includes a third transistor one of a source and a drain of which is coupled to the photoelectric converter.

17. The imaging device according to claim 16, wherein the other of the source and the drain of the third transistor is coupled to the one of the source and the drain of the second transistor.

18. The imaging device according to claim 16, wherein the other of the source and the drain of the third transistor is coupled to the other of the source and the drain of the second transistor.

19. The imaging device according to claim 16, wherein a reference voltage is applied to the other of the source and the drain of the third transistor.

20. The imaging device according to claim 12, further comprising a voltage supply circuit configured to supply two or more different voltages to the other of the source and the drain of the second transistor.

21. The imaging device according to claim 12, further comprising an insulating layer that electrically insulates the first terminal from the gate of the second transistor and the photoelectric converter.

* * * * *